(12) United States Patent
Homma et al.

(10) Patent No.: US 8,461,642 B2
(45) Date of Patent: Jun. 11, 2013

(54) SEMICONDUCTOR DEVICE HAVING A NONVOLATILE MEMORY CELL WITH FIELD EFFECT TRANSISTORS

(75) Inventors: Takuro Homma, Tokyo (JP); Yasushi Ishii, Tokyo (JP); Kota Funayama, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 804 days.

(21) Appl. No.: 12/534,140

(22) Filed: Aug. 2, 2009

(65) Prior Publication Data

US 2010/0059810 A1 Mar. 11, 2010

(30) Foreign Application Priority Data

Sep. 8, 2008 (JP) ................................. 2008-230101

(51) Int. Cl.
*H01L 29/792* (2006.01)
*H01L 21/336* (2006.01)

(52) U.S. Cl.
USPC ......................................... 257/324; 438/261

(58) Field of Classification Search
USPC ............. 257/324, E29.309, E21.409, E21.18, 257/E21.21, E21.423, E21.679
See application file for complete search history.

(56) References Cited

U.S. PATENT DOCUMENTS

| | | | |
|---|---|---|---|
| 6,299,314 B1 * | 10/2001 | Igarashi et al. | 257/288 |
| 6,388,293 B1 * | 5/2002 | Ogura et al. | 257/365 |
| 6,468,857 B2 * | 10/2002 | Igarashi et al. | 438/241 |
| 6,710,412 B2 * | 3/2004 | Tsukamoto et al. | 257/369 |
| 6,717,204 B1 * | 4/2004 | Furuhata et al. | 257/316 |
| 7,045,848 B2 * | 5/2006 | Shukuri | 257/311 |
| 7,067,373 B2 * | 6/2006 | Shukuri | 438/257 |
| 7,087,955 B2 * | 8/2006 | Kawashima et al. | 257/316 |
| 7,326,616 B2 * | 2/2008 | Shukuri | 438/266 |
| 7,339,231 B2 * | 3/2008 | Katayama | 257/317 |
| 7,414,283 B2 * | 8/2008 | Tanaka et al. | 257/314 |
| 7,442,986 B2 * | 10/2008 | Yasui et al. | 257/316 |
| 7,687,850 B2 * | 3/2010 | Ishii et al. | 257/325 |
| 7,939,880 B2 * | 5/2011 | Kang et al. | 257/324 |

(Continued)

FOREIGN PATENT DOCUMENTS

| | | |
|---|---|---|
| JP | 2002-231829 A | 8/2002 |
| JP | 2003-309193 A | 10/2003 |

OTHER PUBLICATIONS

Office Action issued Dec. 21, 2012, in Chinese Patent Application No. 200910160027.6.

*Primary Examiner* — Long Tran
*Assistant Examiner* — Jordan Klein
(74) *Attorney, Agent, or Firm* — Miles & Stockbridge P.C.

(57) ABSTRACT

The present invention can realize a highly-integrated semiconductor device having a MONOS type nonvolatile memory cell equipped with a split gate structure without deteriorating the reliability of the device. A memory gate electrode of a memory nMIS has a height greater by from 20 to 100 nm than that of a select gate electrode of a select nMIS so that the width of a sidewall formed over one (side surface on the side of a source region) of the side surfaces of the memory gate electrode is adjusted to a width necessary for achieving desired disturb characteristics. In addition, a gate electrode of a peripheral second nMIS has a height not greater than the height of a select gate electrode of a select nMIS to reduce the width of a sidewall formed over the side surface of the gate electrode of the peripheral second nMIS so that a shared contact hole is prevented from being filled with the sidewall.

9 Claims, 19 Drawing Sheets

U.S. PATENT DOCUMENTS

| | | | |
|---|---|---|---|
| 2004/0178516 A1* | 9/2004 | Ogata | 257/903 |
| 2004/0188753 A1* | 9/2004 | Kawashima et al. | 257/316 |
| 2004/0238878 A1* | 12/2004 | Sato et al. | 257/315 |
| 2007/0145455 A1 | 6/2007 | Yasui et al. | |
| 2008/0073705 A1* | 3/2008 | Hisamoto et al. | 257/326 |
| 2009/0001449 A1* | 1/2009 | Toba et al. | 257/324 |

* cited by examiner

SEMICONDUCTOR DEVICE HAVING A NONVOLATILE MEMORY CELL WITH FIELD EFFECT TRANSISTORS

CROSS-REFERENCE TO RELATED APPLICATIONS

The disclosure of Japanese Patent Application No. 2008-230101 filed on Sep. 8, 2008 including the specification, drawings and abstract is incorporated herein by reference in its entirety.

BACKGROUND OF THE INVENTION

The present invention relates to a semiconductor device and a manufacturing method thereof. In particular, the invention relates to a technology effective when applied to a semiconductor device having a nonvolatile memory comprised of a memory cell having a MONOS (Metal Oxide Nitride Oxide Semiconductor) structure with a nitride film as a charge storage layer and also to the manufacture of the semiconductor device.

For example, Japanese Patent Laid-Open No. 2003-309193 (Patent Document 1) describes a nonvolatile memory cell transistor having a first gate electrode (control gate electrode) and a second gate electrode (memory gate electrode) placed adjacent to the first gate electrode via an insulating film and a charge storage region. In the structure of the memory cell transistor, the height of the first gate electrode from the substrate surface is made lower than the height of the second gate electrode from the substrate surface or the height, from the substrate surface, of the gate electrode of a transistor formed in a peripheral circuit.

For example, Japanese Patent Laid-Open No. 2002-231829 (Patent Document 2) discloses a nonvolatile memory cell having a select gate electrode and a control gate electrode formed as a sidewall via a gate insulating film over the side surface of the select gate electrode. The control gate electrode and select gate electrode have a predetermined difference in height.

[Patent Document 1] Japanese Patent Laid-Open No. 2003-309193
[Patent Document 2] Japanese Patent Laid-Open No. 2002-231829

SUMMARY OF THE INVENTION

As an electrically rewritable nonvolatile memory, EEPROM (Electrically Erasable Programmable Read Only Memory) using polycrystalline silicon as a floating electrode has been used mainly. In the EEPROM having such a structure, however, if an oxide film surrounding the floating gate electrode has a defect even partially, all the charges stored in a storage node sometimes escape due to abnormal leakage, because the charge storage layer is a conductor. In particular, this problem will become marked further with advance in miniaturization and improvement in integration degree in future.

In recent years, therefore, a MONOS memory cell using a nitride film as a charge storage layer has attracted attentions. In this memory cell, charges contributing to data memory are accumulated in a discrete trap of the nitride film serving as an insulator so that even if an oxide film surrounding a storage node has a defect partially and abnormal leakage occurs, all the charges do not escape from the charge storage layer, making it possible to improve the reliability of data retention.

As the MONOS memory cell, there is proposed a memory cell having a single transistor structure. The memory cell having such a structure is susceptible to disturb compared with the EEPROM memory cell so that there is proposed a memory cell equipped with a select gate electrode, comprised of two transistors, and having a split gate structure.

The MONOS nonvolatile memory cell having a split gate structure has however various technical problems as will be described below.

Some MONOS type nonvolatile memory cells having a split gate structure have a sidewall type memory gate electrode that is formed in self alignment over the side surface of the select gate electrode via an insulating film. In this case, since an alignment margin for photolithography is not necessary in its manufacturing step and the gate length of the memory gate electrode formed in self alignment can be made not greater than the minimum resolution size of photolithography, the size of the memory cell can be made smaller compared with that of a memory cell having a memory gate electrode formed via a photomask.

The present inventors have studied further miniaturization of a memory cell having the above structure and have carried out, for example, development of a memory cell having a select gate electrode and a memory gate electrode whose heights from the substrate surface are reduced to about 100 nm from the current height of 150 nm. A decrease in the height of the select gate electrode and the memory gate electrode from the substrate surface leads to a decrease in the width of a spacer formed over the side surfaces of the memory gate electrode and in turn, a decrease in the distance between the memory gate electrode and source region, causing a problem such as deterioration in disturb characteristics.

The present inventors have also studied further miniaturization of a transistor formed in a peripheral circuit. In forming such a transistor, it is required to decrease the height of a gate electrode from the substrate surface in order to reduce a conduction failure at a shared contact portion. The gate electrode of the transistor formed in the peripheral circuit and a select gate electrode forming a memory cell are formed simultaneously so that a decrease in the height of the select gate electrode and memory gate electrode from the substrate surface means a decrease in the height, from the substrate surface, of the gate electrode of the transistor formed in the peripheral circuit. It is therefore preferred also from the standpoint of reducing a conduction failure at the shared contact portion. As described above, however, a decrease in the height of the select gate electrode and memory gate electrode from the substrate surface leads to deterioration in the disturb characteristics of the memory cell so that the height of the select gate electrode and the memory gate electrode from the substrate surface cannot be reduced and therefore, the height, from the substrate surface, of the gate electrode of the transistor formed in the peripheral circuit cannot be reduced.

An insulating film is placed between the select gate electrode and the memory gate electrode, but formation of a silicide layer over the surfaces of the select gate electrode and the memory gate electrode in self alignment may sometimes cause short-circuit failures between the select gate electrode and the memory gate electrode because the silicide layer grows over the insulating film. As a countermeasure against it, the present inventors have studied excessive etching of the memory gate electrode to make the height of the memory gate electrode from the substrate surface smaller than that of the select gate electrode and insulating film from the substrate surface. Excessive etching of the memory gate electrode however causes excessive etching of the substrate or damages the memory gate electrode, leading to occurrence of new problems such as abnormal appearance and variations in various properties of the memory cell.

An object of the invention is to provide a technology capable of actualizing a highly-integrated semiconductor device having a MONOS type nonvolatile memory cell with a split gate structure without deteriorating the reliability of the semiconductor device.

The above and other objects and novel features of the invention will be apparent from the description herein and accompanying drawings.

Some typical inventions disclosed herein will next be described simply.

In one aspect of the invention, there is thus provided a semiconductor device having a MONOS type nonvolatile memory cell with a split gate structure and comprising a select field effect transistor formed in a first region of a memory region, a memory field effect transistor formed in a second region of the memory region, and a peripheral field effect transistor formed in a peripheral circuit region, wherein an insulating film including a charge storage layer having a charge storage function is formed between a select gate electrode of the select field effect transistor and a memory gate electrode of the memory field effect transistor, a height of the select gate electrode from the main surface of the semiconductor substrate is lower than the height of the memory gate electrode from the main surface of the semiconductor substrate, and the height of a gate electrode of the peripheral field effect transistor from the main surface of the semiconductor substrate is equal to or lower than the height of the select gate electrode from the main surface of the semiconductor substrate.

In another aspect of the invention, there is also provided a manufacturing method of a semiconductor device having a MONOS type nonvolatile memory cell with a split gate structure, which comprises the steps of: forming a first insulating film over the main surface of a semiconductor substrate and then successively depositing a first conductor film and a third insulating film over the first insulating film; successively etching the third insulating film and the first conductor film in the memory region to form, in a first region, a select gate electrode of a select field effect transistor comprised of the first conductor film via the first insulating film; forming a second insulating film including a charge storage layer having a charge storage function over the main surface of the semiconductor substrate and then forming a second conductor film over the second insulating film; etching the second conductor film in the memory region to form, in a second region, a memory gate electrode of a memory field effect transistor comprised of the second conductor film via the second insulating film including the charge storage layer having a charge storage function; removing the third insulating film; processing the first conductor film in a peripheral circuit region to form a gate electrode of a peripheral field effect transistor; and forming a fourth insulating film over the main surface of the semiconductor substrate and etching the fourth insulating film to form sidewalls over the side surfaces of the select gate electrode of the select field effect transistor, the memory gate electrode of the memory field effect transistor, and the gate electrode of the peripheral field effect transistor.

In a further aspect of the invention, there is also provided a manufacturing method of a semiconductor device having a MONOS type nonvolatile memory cell with a split gate structure, which comprises the steps of: forming a first insulating film over the main surface of a semiconductor substrate and then successively depositing a first conductor film and a third insulating film over the first insulating film; successively etching the third insulating film and the first conductor film in the memory region to form, in a first region, a select gate electrode of a select field effect transistor comprised of the first conductor film via the first insulating film; forming a second insulating film including a charge storage layer having a charge storage function over the main surface of the semiconductor substrate and then forming a second conductor film over the second insulating film; etching the second conductor film in the memory region to form, in a second region, a memory gate electrode of a memory field effect transistor comprised of the second conductor film via the second insulating film including the charge storage layer having a charge storage function; removing the third insulating film from the upper surface of the first conductor film in a peripheral circuit region; processing the first conductor film in the peripheral circuit region to form a gate electrode of a peripheral field effect transistor; and forming a fourth insulating film over the main surface of the semiconductor substrate and then etching the fourth insulating film to form sidewalls over the side surfaces of the select gate electrode of the select field effect transistor, the memory gate electrode of the memory field effect transistor, and the gate electrode of the peripheral field effect transistor.

ADVANTAGE OF THE INVENTION

Advantages available by typical inventions disclosed herein will next be described simply.

A highly-integrated semiconductor device having a MONOS type nonvolatile memory cell with a split gate structure can be actualized without deteriorating the reliability of it.

DETAILED DESCRIPTION OF THE PREFERRED EMBODIMENTS

Figure 1:
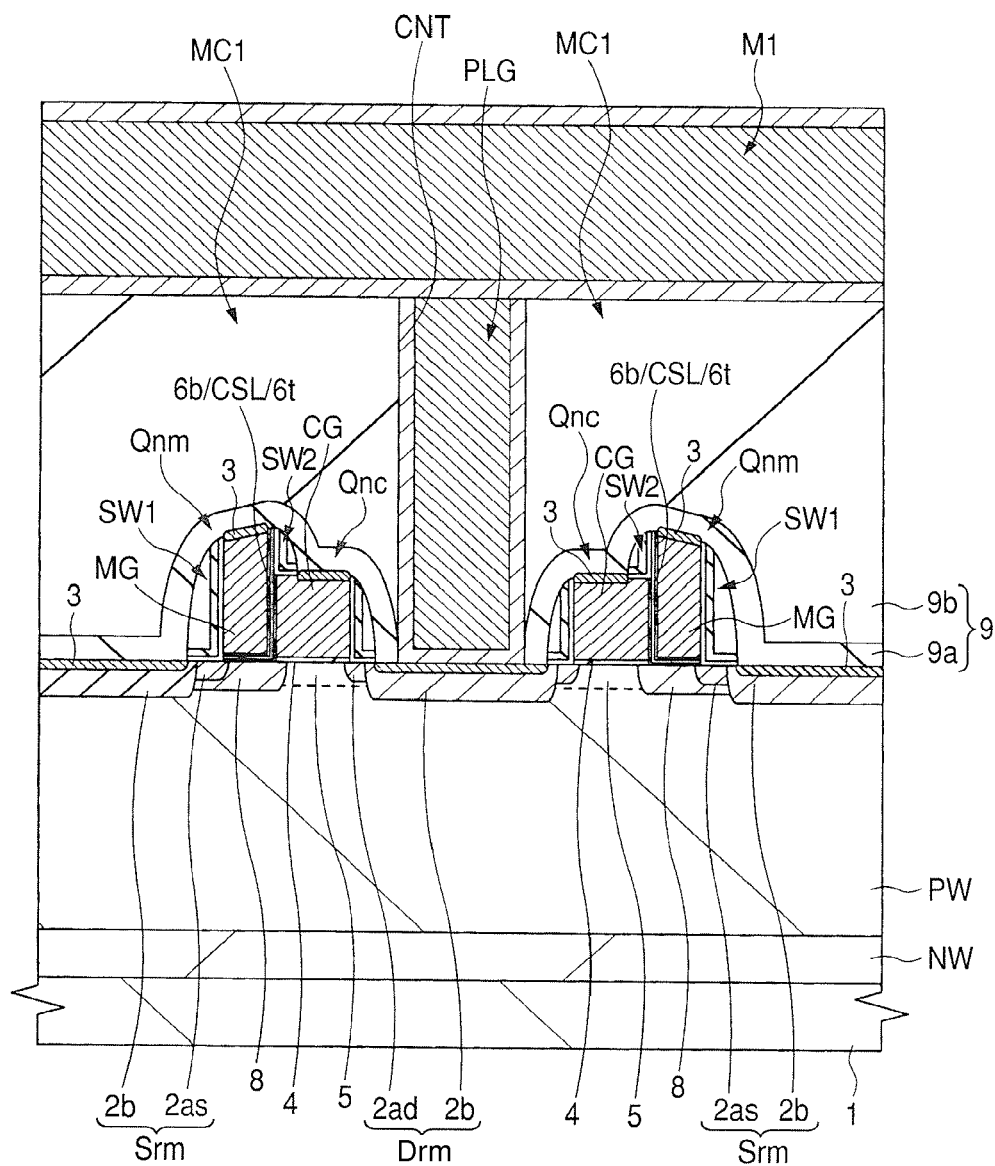
FIG. 1 is a fragmentary cross-sectional view of a memory cell according to Embodiment 1 of the invention which view is obtained by cutting its channel along a direction intersecting with a memory gate.

In the embodiments described below, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the embodiments described below, when a reference is made to the number of elements (including the number, value, amount and range), the number is not limited to a specific number but can be greater than or less than the specific number unless otherwise specifically indicated or principally apparent that the number is limited to the specific number. Moreover in the embodiments described below, it is needless to say that the forming elements (including element steps) are not always essential unless otherwise specifically indicated or principally apparent that they are essential. Similarly, in the embodiments described below, when a reference is made to the shape or positional relationship of the constituent elements, that substantially analogous or similar to it is also embraced unless otherwise specifically indicated or principally apparent that it is not. This also applies to the above-described value and range.

Further, in the embodiments described below, MIS-FET (Metal Insulator Semiconductor Field Effect Transistor) representing a field effect transistor is abbreviated as MIS, and an n-channel type MIS-FET is abbreviated as nMIS. In addition, needless to say, an MONOS type memory cell indicated in this embodiment is also contained in the subordinate concept of the MIS. In addition, silicon nitride in the embodiments includes not only $Si_3N_4$ but also insulating films having a similar composition made of nitride of silicon. In addition, a wafer in the embodiments indicates mainly an Si (Silicon) single crystal wafer, as well as an SOI (Silicon On Insulator) wafer, an insulating film substrate for forming an integrated circuit thereon, etc. Shapes thereof include not only a circle and a nearly circle, but also a square, a rectangle and the like.

Further, in all the drawings for describing the embodiments, like members of a function will be identified by like reference numerals and overlapping descriptions will be omitted. The embodiments of the invention will hereinafter be described specifically referring to drawings.

Embodiment 1

One example of the structure of a nonvolatile memory cell according to Embodiment 1 of the invention will hereinafter be described referring to FIGS. 1 and 2. FIG. 1 is a fragmentary cross-sectional view of a memory cell obtained by cutting its channel along a direction intersecting with a memory gate electrode; and FIG. 2 includes an enlarged fragmentary cross-sectional view of a portion of the memory cell illustrated in FIG. 1 and a fragmentary cross-sectional view of an nMIS formed in a peripheral circuit region. The memory cell illustrated in these drawings is a memory cell having a split gate structure while having a sidewall-like memory gate electrode.

Figure 2:
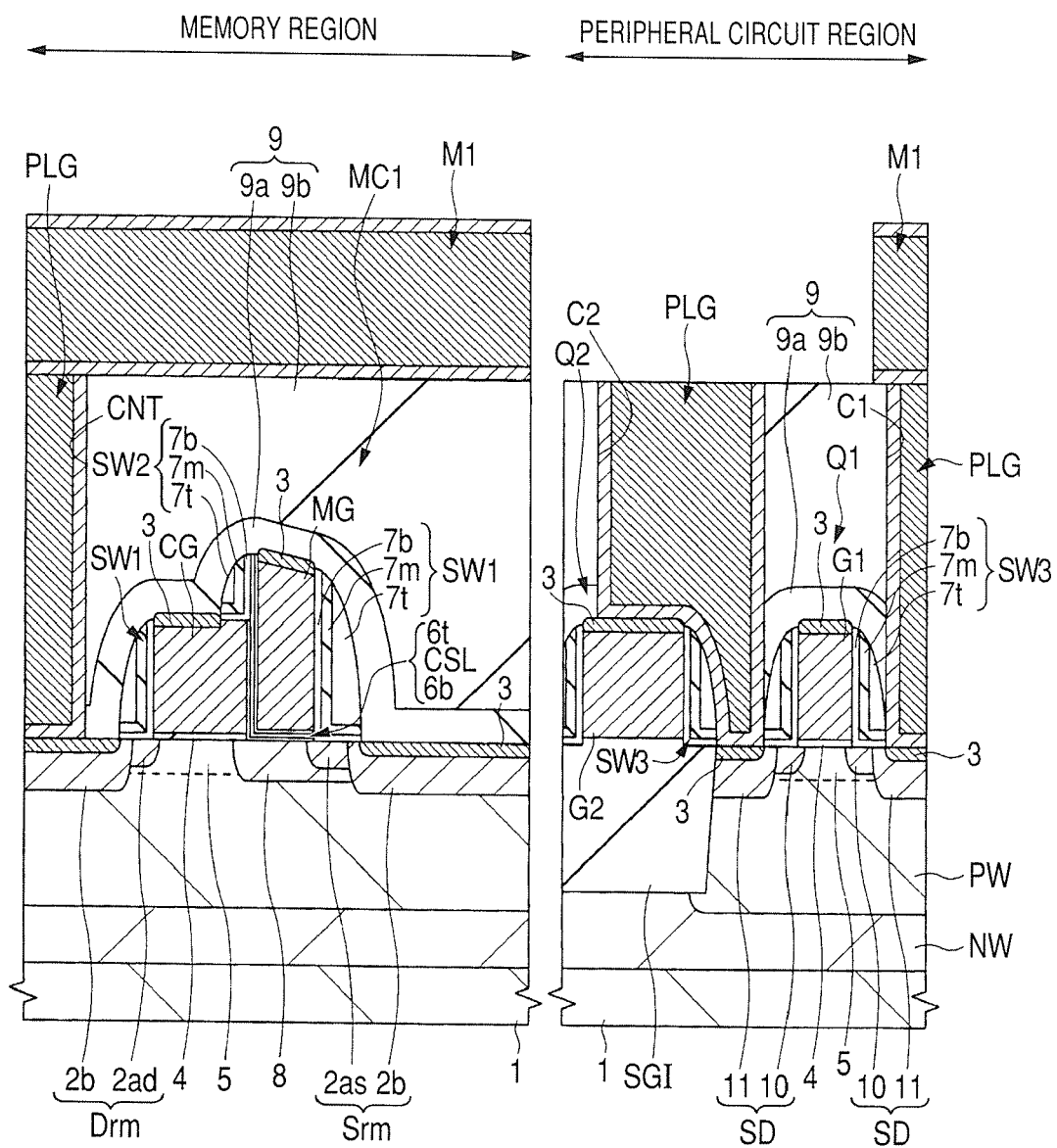
FIG. 2 includes a fragmentary cross-sectional view of a memory cell formed in a memory region and a fragmentary cross-sectional view of a peripheral first nMIS and a peripheral second nMIS formed in a peripheral circuit region according to Embodiment 1 of the invention.
Figure 28:
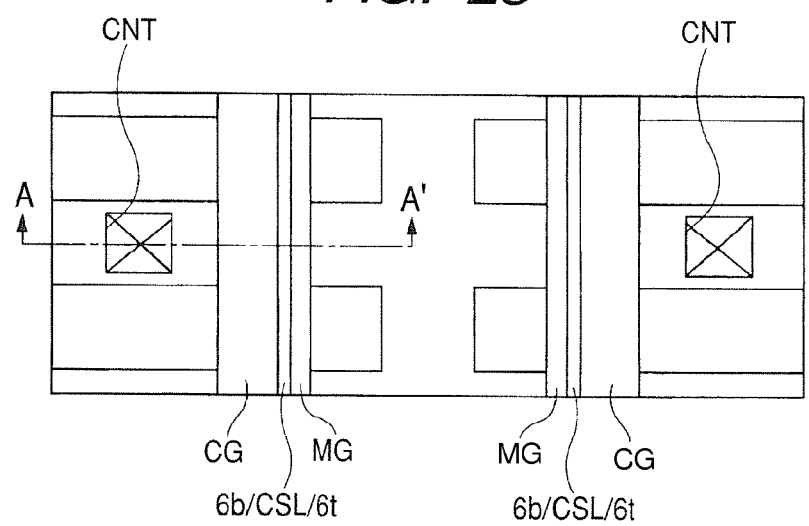
FIG. 28 is a planar layout of the nonvolatile memory cell according to the present embodiment.
Figure 29:
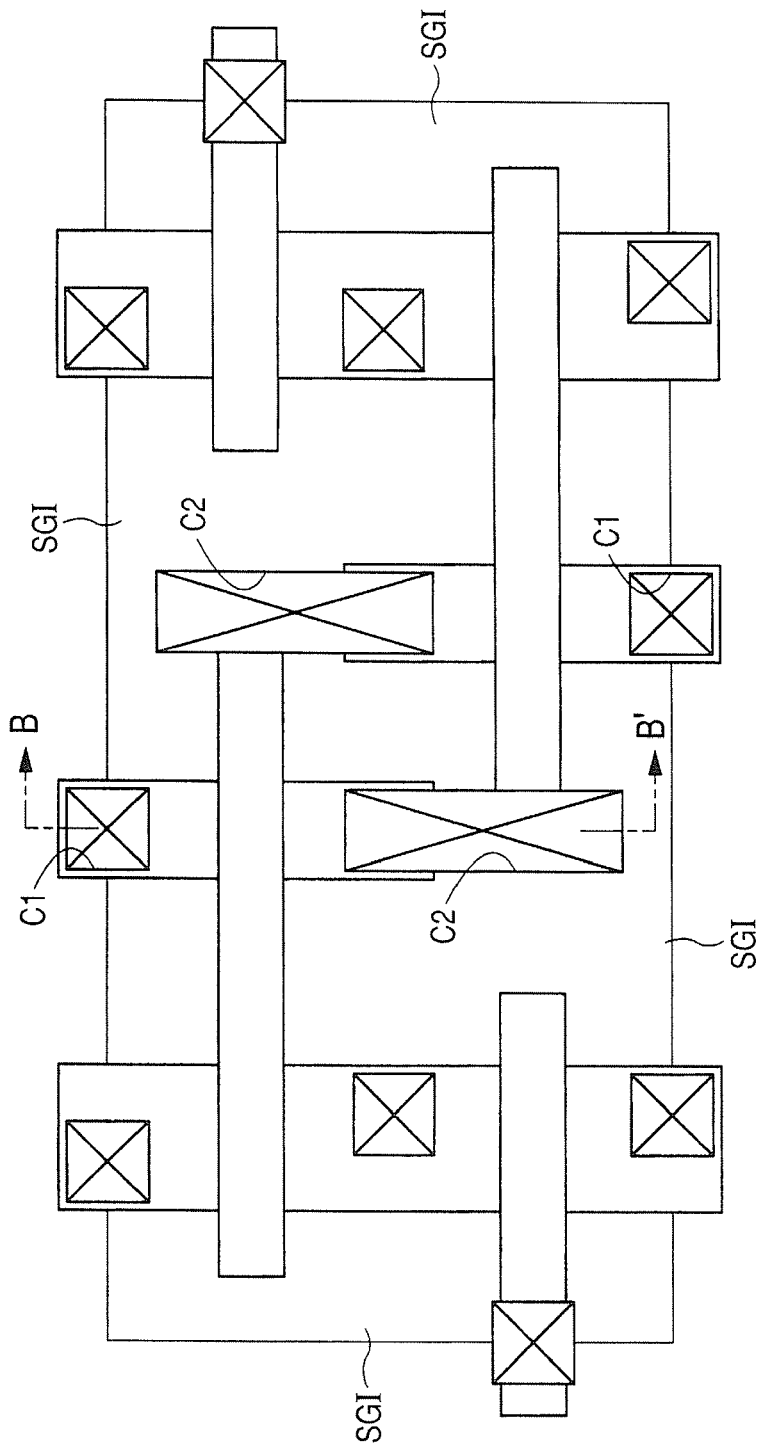
FIG. 29 illustrates a planar layout of an SRAM according to the present Embodiment.

The memory region of FIG. 2 corresponds to the cross-sectional view taken along a line A-A' of the planar layout of the nonvolatile cell illustrated in FIG. 28. As the peripheral circuit region of FIG. 2, a SRAM memory cell is illustrated in this Embodiment. The peripheral circuit region of FIG. 2 corresponds to the cross-sectional view taken along a line B-B' of the planar layout of SRAM illustrated in FIG. 29. It is a cross-sectional view illustrating a gate electrode of a load MIS-FET (Qp1) and a source region of a load MIS-FET (Qp2), illustrated in FIG. 30, coupled to each other via a contact hole. Such a contact hole will be called "shared contact hole" later.

Figure 30:
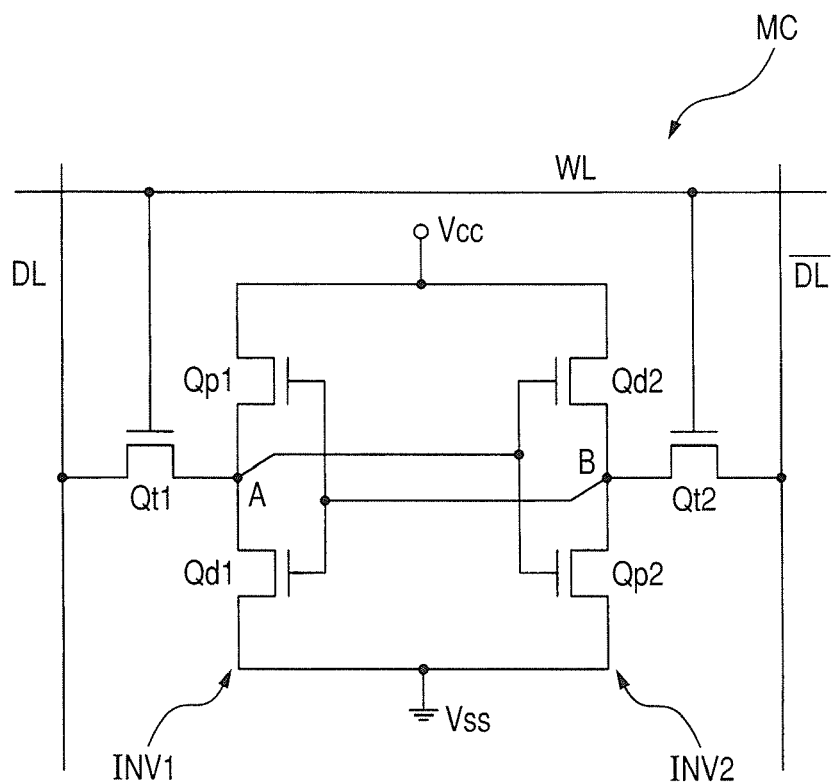
FIG. 30 is an equivalent circuit diagram of an SRAM illustrated in FIG. 29.

FIG. 30 is an equivalent circuit diagram of an SRAM memory cell. As illustrated in this drawing, this memory cell MC is placed at an intersection between a pair of complementary data lines (data line DL, data line/(bar) DL) and a word line WL and is comprised of a pair of drive MIS-FETs (Qd1, Qd2), a pair of load MIS-FETs (Qp1, Qp2), and a pair of transfer MIS-FETs (Qt1, Qt2). The drive MIS-FETs (Qd1, Qd2) and the transfer MIS-FETs (Qt1, Qt2) are each an n-channel MIS-FET, while the load MIS-FETs (Qp1, Qp2) are each a p channel MIS-FET.

Of the six MIS-FETs forming the memory cell MC, the drive MIS-FET (Qd1) and the load MIS-FET (Qp1) form a CMOS inverter INV1, while the drive MIS-FET (Qd2) and the load MIS-FET (Qp2) form a CMOS inverter INV2. Input/output terminals (storage nodes A and B) of the pair of CMOS inverters INV1 and INV2 are cross-linked and form a flip flop circuit as a data storage portion for storing 1 bit of data. One of the input/output terminals (storage node A) of this flip flop circuit is coupled to one of source and drain regions of the transfer MIS-FET (Qt1), while the other input/output terminal (storage node B) is coupled to one of the source and drain regions of the transfer MIS-FET (Qt2).

The other one of the source and drain regions of the transfer MIS-FET (Qt1) is coupled to the data line DL, while the other one of the source and drain regions of the transfer MIS-FET (Qt2) is coupled to the data line/DL. One end (source region of each of the load MIS-FETs (Qp1 and Qp2)) of the flip flop circuit is coupled to a supply voltage (Vcc), while the other end (source region of each of the load MIS-FETs (Qd1 and Qd2)) is coupled to a reference voltage (Vss).

To describe the operation of the circuit, when the storage node A of the CMOS inverter INV1 is at a high potential ("H"), the drive MIS-FET (Qd2) is turned ON so that the storage node B of the other CMOS inverter INV2 is switched to low potential ("L"). Accordingly, the drive MISFET (Qd1) is turned OFF and the high potential ("H") of the storage node A is retained. This means that the states of the storage nodes A and B are retained by a latch circuit in which the paired CMOS inverters INV1 and INV2 are cross-linked and the data is retained as long as the supply voltage is applied.

The word line WL is coupled to the gate electrode of each of the transfer MIS-FETs (Qt1 and/Qt2) and conduction or non-conduction of the transfer MIS-FETs (Qt1 and Qt2) is controlled by this word line WL. This means that when the word line WL is set to high potential ("H"), the transfer MISFETs (Qt1 and Qt2) are switched ON, so the latch circuit and complementary data lines (data lines DL and/DL) are electrically coupled. The potential state ("H" or "L") of the storage nodes A and B is thus made to appear on data lines DL and/DL to be read as data in the memory cell MC.

To write data into the memory cell MC, the word line WL is set to "H" potential level, the transfer MISFETs Qt1 and Qt2 are switched ON, and the data on the data lines DL and/DL are transmitted to storage nodes A and B.

The structure of a memory cell MC1 formed in a memory region will next be described.

A semiconductor substrate 1 is made of, for example, p type single crystal silicon and has, in the active region over the main surface (device formation surface) of the substrate, a select nMIS (first field effect transistor) Qnc and a memory nMIS (second field effect transistor) Qnm. A drain region Drm of this memory cell MC1 has, for example, a relatively lightly-doped n⁻ type semiconductor region 2ad and a relatively heavily-doped n⁺ type semiconductor region 2b having a higher impurity concentration than the n⁻ type semiconductor region 2ad (LDD (Lightly Doped Drain) structure). A source region Srm of this memory cell MC1 has, for example, a relatively lightly-doped n⁻ type semiconductor region 2as and a relatively heavily-doped n⁺ type semiconductor region 2b having a higher impurity concentration than the n⁻ type semiconductor region 2as (LDD structure). The n⁻ type semiconductor regions 2ad and 2as are placed on the side of a channel region of the memory cell MC1, while the n⁺ type semiconductor regions 2b are placed at positions separated by distances corresponding to the n⁻ type semiconductor regions 2ad and 2as from the side of the channel region of the memory cell MC1, respectively.

A select gate electrode (first gate electrode) CG of the select nMIS (Qnc) and a memory gate electrode (second gate electrode) MG of the memory nMIS (Qnm) extend adjacent to each other over the main surface of the semiconductor substrate 1 between the drain region Drm and the source region Srm. In this extending direction, a plurality of memory cells MC1 are adjacent to each other via an element isolation portion formed in the semiconductor substrate 1. The select gate electrode CG and the memory gate electrode MG are each made of, for example, n type low-resistance polycrystalline silicon. The select gate electrode CG has a gate length of, for example, from about 80 to 120 nm and the memory gate electrode MG has a gate length of from about 50 to 100 nm. The height of the select gate electrode CG from the main surface of the semiconductor substrate 1 is from about 100 to 150 nm and the height of the memory gate electrode MG from the main surface of the semiconductor substrate 1 is higher by about from 5 to 100 nm than the height of the select gate electrode CG from the main surface of the semiconductor substrate 1.

A silicide layer 3 such as cobalt silicide is formed over the upper surface of the select gate electrode CG and the memory gate electrode MG. The thickness of the silicide layer 3 is for example about 20 nm. In the MONOS type memory cell, potentials should be supplied to both the select gate electrode CG and the memory gate electrode MG and its operation rate greatly depends on the resistance of the select gate electrode CG and the memory gate electrode MG. It is therefore desired to form the silicide layer 3 to reduce the resistance of the select gate electrode CG and the memory gate electrode MG. This silicide layer 3 is also formed over the upper surface of the n⁺ type semiconductor region 2b forming the source region Srm or the drain region Drm.

The select gate electrode CG and the main surface of the semiconductor substrate 1 have therebetween a gate insulating film (first insulating film) 4 made of, for example, a silicon oxide film as thin as approximately from 1 to 5 nm. The select gate electrode CG is located over the element isolation portion and over a first region of the semiconductor substrate 1 via the gate insulating film 4. For example, boron is introduced into the main surface of the semiconductor substrate 1 below the gate insulating film 4 to form a p-type semiconductor region 5. The semiconductor region 5 is a semiconductor region for forming a channel of the select nMIS (Qnc) and by this semiconductor region 5, the threshold voltage of the select nMIS (Qnc) is set to a predetermined value.

The memory gate electrode MG is provided over a side surface of the select gate electrode CG, and the select gate electrode CG and the memory gate electrode MG are isolated from each other by, as a gate insulating film, a film stack of an insulating films 6b, a charge storage layer CSL, and an insulating film 6t (a second insulating film which will hereinafter be called "insulating films 6b and 6t and charge storage layer CSL"). The memory gate electrode MG is located over a second region of the semiconductor substrate 1 via the insulating films 6b and 6t and charge storage layer CSL. In FIG. 1, the insulating films 6b and 6t and charge storage layer CSL are expressed as 6b/CSL/6t.

The charge storage layer CSL is made of, for example, silicon nitride and has a thickness of, for example, from about 5 to 20 nm. The insulating films 6b and 6t are made of, for example, silicon oxide. The insulating film 6b has a thickness of, for example, from about 1 to 10 nm, while the insulating film 6t has a thickness of, for example, from about 4 to 15 nm. The insulating films 6b and 6t may be made of nitrogen-containing silicon oxide. The height, from the main surface of the semiconductor substrate 1, of the insulating film 6b placed between the select gate electrode CG and the memory gate electrode MG is much the same with the height of the upper surface of the select gate electrode CG from the main surface of the semiconductor substrate 1, while the height of each of the insulating film 6t and the charge storage layer CSL, from the main surface of the semiconductor substrate 1, placed between the select gate electrode CG and the memory gate electrode MG is much the same with the height of the upper surface of the memory gate electrode MG from the main surface of the semiconductor substrate 1.

A sidewall SW1 is formed over one of the side surfaces (the side surface on a side opposite to the memory gate electrode MG, that is, the side surface on the side of the drain region Drm) of the select gate electrode CG and one of the side surfaces (the side surface on a side opposite to the select gate electrode CG, that is, the side surface on the side of the source region Srm) of the memory gate electrode MG. The sidewall SW1 is comprised of a film stack (fourth insulating film) made of, for example, a silicon oxide film 7b, a silicon nitride film 7m, and a silicon oxide film 7t. The silicon oxide film 7b has a thickness of, for example, 20 nm; the silicon nitride film 7m has a thickness of, for example, 25 nm; and the silicon oxide film 7t has a thickness of, for example, 50 nm. Since the height of the memory gate electrode MG from the main surface of the semiconductor substrate 1 is higher than the height of the select gate electrode CG from the main surface of the semiconductor substrate 1, the sidewall SW1 formed over the one of the side surfaces of the memory gate electrode MG and the sidewall SW1 formed over the one of the side surfaces of the select gate electrode CG differ greatly in width from each other. Described specifically, the width of the sidewall SW1 formed over the one of the side surfaces of the memory gate electrode MG becomes greater than the width of the sidewall SW1 formed over the one of the side surfaces of the select gate electrode CG. The width of the sidewall SW1 formed over the one of the side surfaces of the memory gate electrode MG is, for example, 50 nm, while the width of the sidewall SW1 formed over the one of the side surfaces of the select gate electrode CG is, for example, 40 nm.

Further, a sidewall SW2 formed as the same layer as the sidewall SW1 of the memory gate electrode MG and comprised of a film stack made of the silicon oxide film 7b, the silicon nitride film 7m, and the silicon oxide film 7t is formed over one of the side surfaces of the memory gate electrode on the side of the select gate electrode CG and the upper surface of the select gate electrode CG. The sidewall SW2 placed over the upper surface of the select gate electrode CG has a width of, for example, about 15 nm. The sidewall SW2, the insulating film 6t, and the charge storage layer CSL serving together as a wall can suppress a short-circuit between the silicide layer 3 formed over the upper surface of the select gate electrode CG and the silicide layer 3 formed over the upper surface of the memory gate electrode MG.

An n type semiconductor region 8 is formed by introducing, for example, arsenic or phosphorus into the main surface of the semiconductor substrate 1 between the p type semiconductor region 5 and the source region Srm below the insulating film 6b. This semiconductor region 8 is a region for forming the channel of the memory nMIS (Qnm) and the threshold voltage of the memory nMIS (Qnm) is set to a specific value by this semiconductor region 8. The memory cell MC1 is covered with an interlayer insulating film 9 comprised of a film stack made of, for example, a silicon nitride film 9a and a silicon oxide film 9b. In the interlayer insulating film 9, a contact hole CNT reaching the drain region Drm is formed. A first-level interconnect M1 extending in a direction crossing the memory gate electrode MG (or select gate electrode CG) is coupled to the drain region Drm via a plug PLG filled in the contact hole CNT.

The structures of a peripheral first nMIS (Q1) and a peripheral second nMIS (Q2) formed in the peripheral circuit region will next be described. The peripheral first nMIS (Q1) and the peripheral second nMIS (Q2) have almost the same structure. A contact hole C1 reaching one of the source/drain regions SD of the peripheral first nMIS (Q1) and a contact hole (shared contact hole) C2 reaching the other one of the source/drain regions SD of the peripheral first nMIS (Q1) and a gate electrode G2 of the peripheral second nMIS (Q2) and therefore common to them are formed. Via a plug PLG filled in the shared contact hole C2, the other one of the source/drain regions of the peripheral first nMIS (Q1) is electrically coupled to the gate electrode G2 of the peripheral second nMIS (Q2). FIG. 2 is a fragmentary cross-sectional view of the shared contact portion in the peripheral first nMIS (Q1) and the peripheral second nMIS (Q2) formed adjacent to each other in the peripheral circuit region.

An active region having a periphery defined by an element isolation portion SGI is formed in the main surface of the substrate 1. The peripheral first nMIS (Q1) and the peripheral second nMIS (third field effect transistor) Q2 are placed over the main surface of this active region.

A gate insulating film 4 of the peripheral first nMIS (Q1) and the peripheral second nMIS (Q2) made of an insulating film formed as the same layer as the gate insulating film 4 of the select nMIS (Qnc) is formed over the main surface of the semiconductor substrate 1. The gate insulating film 4 has therefore a thickness of, for example, about from 1 to 5 nm. A gate electrode G1 of the peripheral first nMIS (Q1) and a gate electrode (third gate electrode) G2 of the peripheral second nMIS (Q2) made of a conductor film as the same layer as the select gate electrode CG of the select nMIS (Qnc) is formed over the gate insulating film 4. The gate electrodes G1 and G2 have a thickness of, for example, from about 100 to 150 nm. The height of them is set equal to or lower than the height of the select gate electrode CG of the select nMIS (Qnc) from the main surface of the semiconductor substrate 1. The gate electrodes G1 and G2 have a gate length of, for example, about 65 nm.

The gate electrodes G1 and G2 have, on the side surfaces thereof, a sidewall SW3 made of an insulating film of the same layer as the sidewalls SW1 and SW2 formed over the side surface of the select gate electrode CG of the select nMIS (Qnc) and the side surfaces of the memory gate electrode MG of the memory nMIS (Qnm). The gate electrodes G1 and G2 are however formed of a conductor film of the same layer as the select gate electrode CG of the select nMIS (Qnc) and the height of the gate electrodes G1 and G2 from the main surface of the semiconductor substrate 1 is equal to or lower than the height of the select gate electrode CG of the select nMIS (Qnc) from the main surface of the semiconductor substrate 1 so that the width of the sidewall SW3 becomes equal to or smaller than the width of the sidewall SW1 formed over the side surface of the select gate electrode CG of the select nMIS (Qnc). The width is, for example, 35 nm or less.

The source/drain regions SD of the peripheral first nMIS (Q1) have an LDD structure equipped with a relatively lightly-doped n⁻ type semiconductor region 10 and a relatively heavily-doped n⁺ type semiconductor region 11 having a higher impurity concentration than the n⁻ type semiconductor region 10. The n⁻ type semiconductor region 10 is placed on the side of the channel region of the peripheral first nMIS (Q1), while the n⁺ type semiconductor region 11 is placed at a position separated by a distance corresponding to the n⁻ type semiconductor region 10 from the side of the channel region of the peripheral first nMIS (Q1). Although not illustrated herein, the source/drain regions SD of the peripheral second nMIS (Q2) also have an LDD structure equipped with a relatively lightly-doped n⁻ type semiconductor region 10 and a relatively heavily-doped n⁺ type semiconductor region 11 having a higher impurity concentration than the n⁻ type semiconductor region 10.

The peripheral first nMIS (Q1) and the peripheral second nMIS (Q2) are covered with the interlayer insulating film 9. A contact hole C1 reaching one of the source/drain regions SD of the peripheral first nMIS (Q1) is formed in the interlayer insulating film 9. In addition, a shared contact hole C2 reaching both the other one of the source/drain regions SD of the peripheral first nMIS (Q1) and the gate electrode G2 of the peripheral second nMIS (Q2) is formed in the interlayer insulating film 9. A first-level interconnect M1 is electrically coupled to the one of the source/drain regions SD of the peripheral first nMIS (Q1) via a plug PLG filled in the contact hole C1. In addition, the other one of the source/drain regions SD of the peripheral first nMIS (Q1) and the gate electrode G2 of the peripheral second nMIS (Q2) are electrically coupled to each other via a plug PL filled in the shared contact hole C2.

By differentiating the height of the memory gate electrode MG of the memory nMIS (Qnm) from the main surface of the semiconductor substrate 1 from the height of the select gate electrode CG of the select nMIS (Qnc) from the main surface of the semiconductor substrate 1 and setting the height of the memory gate electrode MG of the memory nMIS (Qnm) from the main surface of the semiconductor substrate 1 at a specific height higher than the height of the select gate electrode CG of the select nMIS (Qnc) from the main surface of the semiconductor substrate 1 in such a manner, the sidewall SW1 formed over one (side surface on the side of the source region Srm) of the side surfaces of the memory gate electrode MG of the memory nMIS (Qnm) of the memory cell MC1 can have a width necessary for providing the memory cell MC1 with desired disturb characteristics.

Even if the sidewall SW1 formed over one (side surface on the side of the source region Srm) of the side surfaces of the memory gate electrode MG of the memory nMIS (Qnm) is large, the width of the sidewall SW1 formed over one (side surface on the side of the drain region Drm) of the side surfaces of the select gate electrode CG of the select nMIS (Qnc) can be made smaller than the width of the sidewall SW1 formed over one (side surface on the side of the source region Srm) of the side surfaces of the memory gate electrode MG of the memory MIS (Qnm) by setting the height of the select gate electrode CG of the select nMIS (Qnc) from the main surface of the semiconductor substrate 1 at a specific height lower than the height of the memory gate electrode MG of the memory nMIS (Qnm) from the main surface of the semiconductor substrate 1. Accordingly, in the peripheral second nMIS (Q2) formed in the peripheral circuit region having the gate electrode G2 having a height equal to or lower than the height of the gate electrode CG of the select nMIS (Qnc) from the main surface of the semiconductor substrate 1, the width of the sidewall SW3 formed on both of the side surfaces of the gate electrode G2 can be made equal to or smaller than the width of the sidewall SW1 formed over one (side surface on the side of the drain region Drm) of the side surfaces of gate electrode CG of the select nMIS (Qnc). As a result, it becomes possible to prevent the shared contact hole C2 from being filled with the sidewall SW3 and reduce a conduction failure between the source/drain regions SC and the plug PLG.

Thus, the memory cell MC1 can have desired disturb characteristics by forming the sidewall SW1 over one (side surface on the side of the source region Srm) of the side surfaces of the memory gate electrode MG of the memory nMIS (Qnm) to have a relatively large width. Moreover, it is possible to prevent the shared contact hole C2 from being filled with the sidewall SW3 and reduce a conduction failure in the shared contact hole C2 by relatively decreasing the width of the sidewall SW3 formed over both of the side surfaces of the gate electrode G2 of the peripheral second nMIS (Q2) in the peripheral circuit region.

A first example (in which a select gate electrode CG of a select nMIS (Qnc) and a gate electrode G2 of a peripheral second nMIS (Qn) have an equal height, each from the main surface of the semiconductor substrate 1) of a manufacturing method of a semiconductor device will next be described referring to FIGS. 3 to 16. FIGS. 3 to 16 are each a fragmentary cross-sectional view of a memory region and a peripheral circuit region in the manufacturing steps of the semiconductor device. They illustrate the same parts as the fragmentary cross-sectional view of FIG. 2 illustrating the memory cell MC1 and the peripheral first nMIS (Q1) and the peripheral second nMIS (Q2) formed in the peripheral circuit region First, for example, a groove type element isolation region SGI and an active region surrounding the element isolation region therewith are formed in the main surface of the semiconductor substrate (at this stage, a planar, substantially circular, thin semiconductor plate called "semiconductor wafer"). Described specifically, after formation of isolation grooves in predetermined positions of the semiconductor substrate 1, an insulating film made of, for example, silicon oxide is deposited over the main surface of the semiconductor substrate 1, followed by polishing the insulating film by CMP (Chemical Mechanical Polishing) to leave the insulating film only in the isolation groove, whereby the element isolation region SGI is formed.

Figure 3:
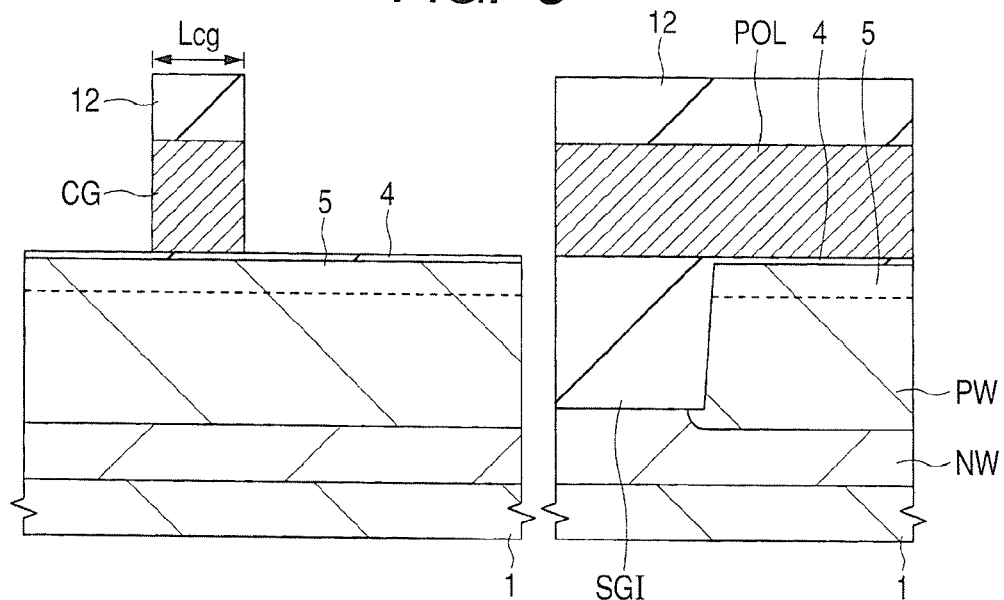
FIG. 3 is a fragmentary cross-sectional view of a semiconductor device according to a first example of Embodiment 1 of the invention during a manufacturing step thereof.

As illustrated in FIG. 3, a predetermined impurity is introduced selectively into a predetermined portion of the semiconductor substrate 1 at a predetermined energy by ion implantation or the like to form a buried n well NW and p well PW. Then, a p type impurity such as boron is introduced into the main surface of the semiconductor substrate 1 by ion implantation to form a p type semiconductor region 5 for the formation of the channel of the select nMIS (Qnc) and a p type semiconductor region 5 for the formation of the channel of the peripheral first nMIS (Q1) and the peripheral second nMIS (Q2). The semiconductor region for the formation of the channel of the select nMIS (Qnc) and the semiconductor region for the formation of the channel of the peripheral first nMIS (Q1) and the peripheral second nMIS (Q2) may also be formed by different steps.

Then, the semiconductor substrate 1 is subjected to oxidation treatment to form a gate insulating film 4 made of, for example, silicon oxide and having a thickness of from about 1 to 5 nm over the main surface of the semiconductor substrate 1. Over the main surface of the semiconductor substrate 1, a conductor film POL made of, for example, low-resistance polycrystalline silicon and an insulating film (third insulating film) 12 made of, for example, silicon oxide or silicon nitride are deposited by CVD (Chemical Vapor Deposition). The conductor film POL has a thickness of, for example, about 140 nm and the insulating film 12 has a thickness of, for example, about from 20 to 100 nm. The insulating film 12 and the conductor film POL in the memory region are patterned successively by lithography and dry etching to form a select gate electrode CG of the select nMIS (Qnc) made of the conductor film POL. The select gate electrode CG has a gate length Lcg of, for example, about 100 nm.

Figure 4:
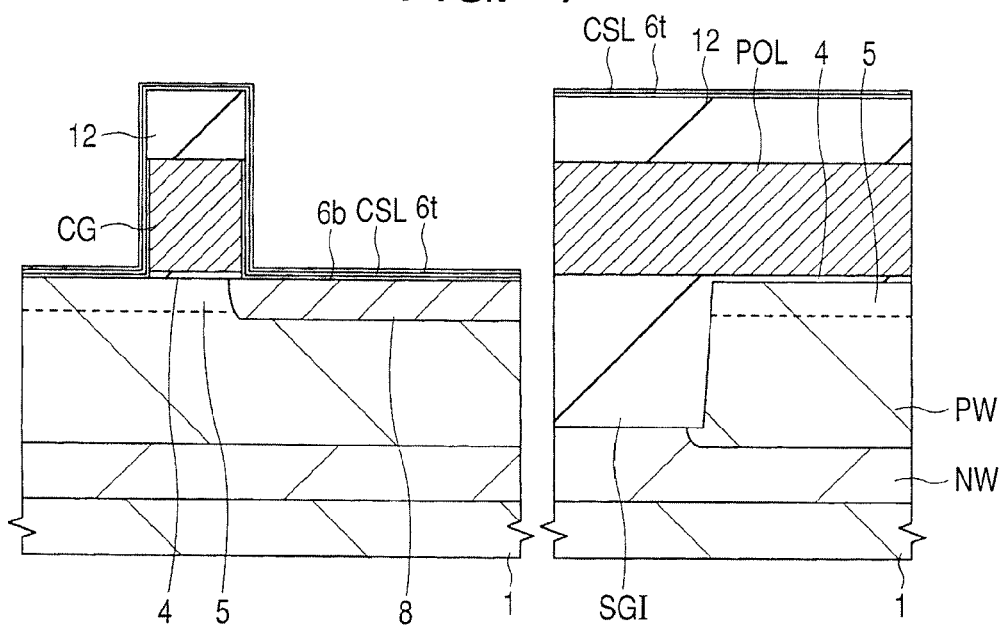
FIG. 4 is a fragmentary cross-sectional view of the semiconductor device during a manufacturing step following that of FIG. 3.

As illustrated in FIG. 4, with the insulating film 12 and the select gate electrode CG of the select nMIS (Qnc), and a resist pattern as a mask, an n type impurity, for example, arsenic or phosphorus is ion-implanted into the main surface of the semiconductor substrate 1 in the memory region to form an n type semiconductor region 8 for the formation of the channel of the memory nMIS (Qnm).

An insulating film 6b made of, for example, silicon oxide, a charge storage layer CSL made of silicon nitride, and an insulating film 6t made of silicon oxide are formed successively over the main surface of the semiconductor substrate 1. The insulating film 6b is formed by, for example, thermal oxidation or ISSG oxidation and has a thickness of, for example, about from 1 to 10 nm. The charge storage layer CSL is formed by CVD and has a thickness of, for example, about from 5 to 20 nm. The insulating film 6t is formed, for example, by CVD or ISSG oxidation and it has a thickness of, for example, about from 4 to 15 nm. The charge storage layer CSL may also be formed by silicon nanodot technology.

Figure 5:
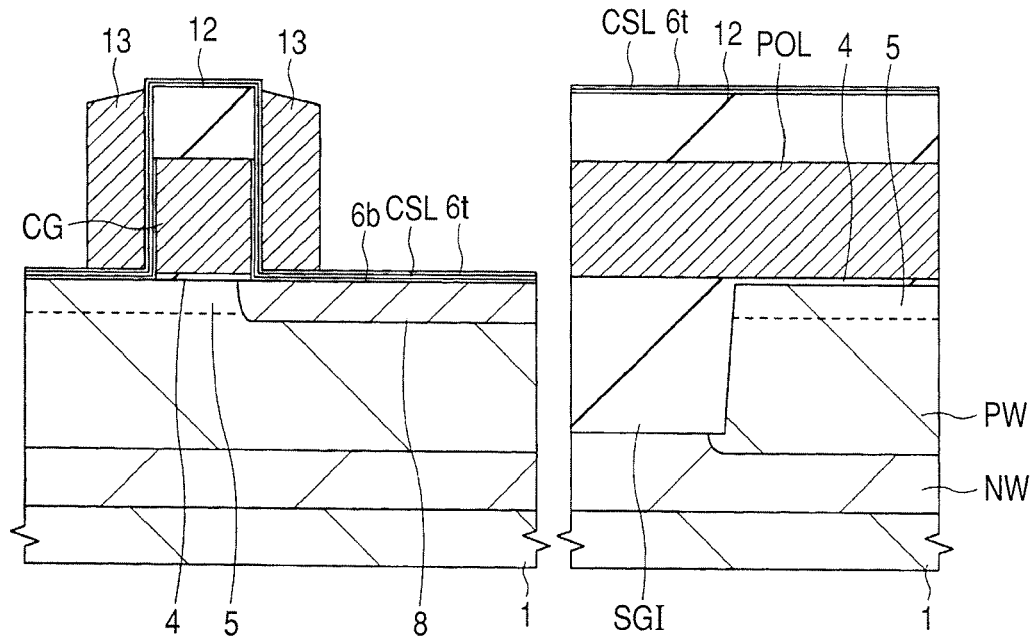
FIG. 5 is a fragmentary cross-sectional view of the semiconductor device during a manufacturing step following that of FIG. 4.

A conductor film made of low-resistance polycrystalline silicon and to be used for the formation of a memory gate is then deposited over the main surface of the semiconductor substrate 1. This conductor film is formed by CVD and it has a thickness of, for example, from about 50 to 100 nm. By using lithography and dry etching, the conductor film is etched back by anisotropic dry etching to form, as illustrated in FIG. 5, a sidewall 13 over both of the side surfaces of a film stack comprised of the insulating film 12 and the select gate electrode CG of the select nMIS (Qnc) via the insulating films 6b and 6t and the charge storage layer CSL.

Figure 6:
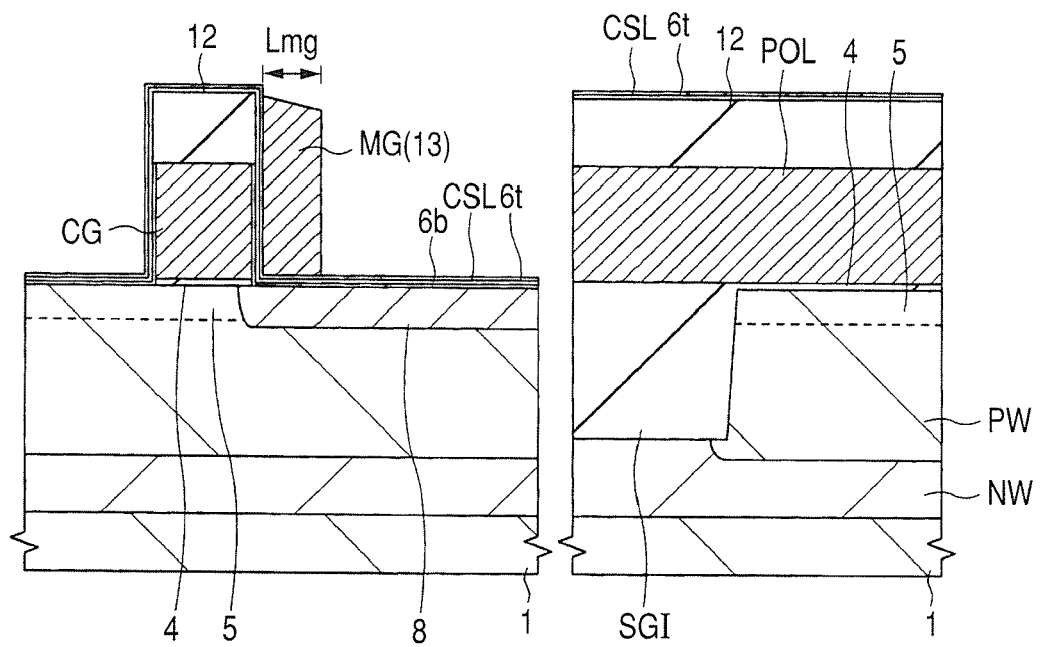
FIG. 6 is a fragmentary cross-sectional view of the semiconductor device during a manufacturing step following that of FIG. 5.

As illustrated in FIG. 6, with a resist pattern as a mask, the sidewall 13 exposed therefrom is then etched to form a memory gate electrode MG (sidewall 13) of the memory nMIS (Qnm) over only one of the side surfaces of the film stack made of the insulating film 12 and the select gate electrode CG of the select nMIS (Qnc). The memory gate electrode MG has a gate length Lmg of, for example, about 65 nm.

Figure 7:
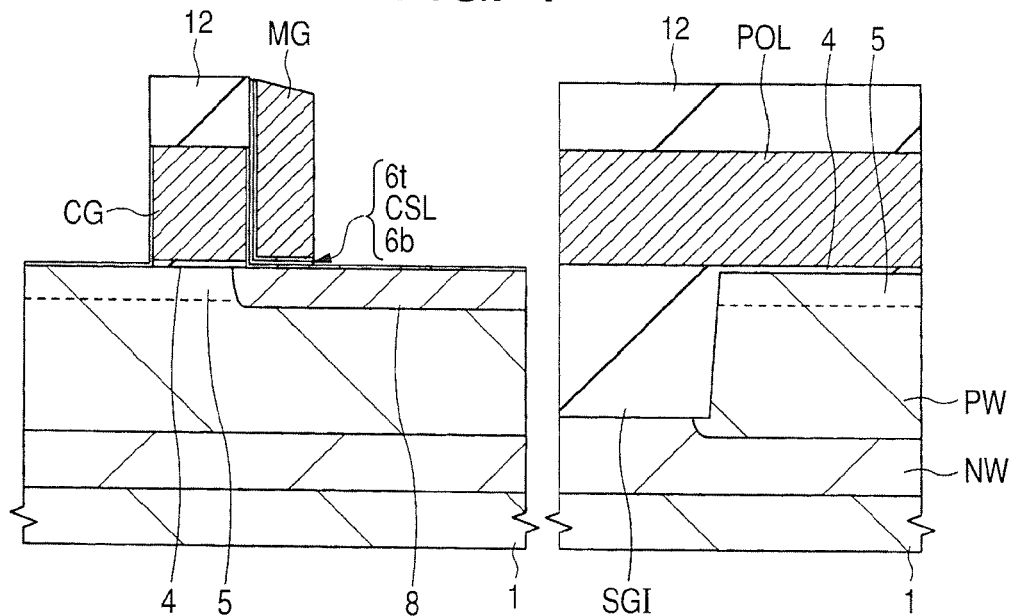
FIG. 7 is a fragmentary cross-sectional view of the semiconductor device during a manufacturing step following that of FIG. 6.

As illustrated in FIG. 7, the insulating films 6b and 6t and the charge storage layer CSL are left between the film stack made of the insulating film 12 and the select gate electrode CG of the select nMIS (Qnc) and the memory gate electrode MG of the memory nMIS (Qnm) and between the semiconductor substrate 1 and the memory gate electrode MG of the memory nMIS (Qnm) and the insulating film 6t and the charge storage layer CSL in the other region are selectively etched.

Figure 8:
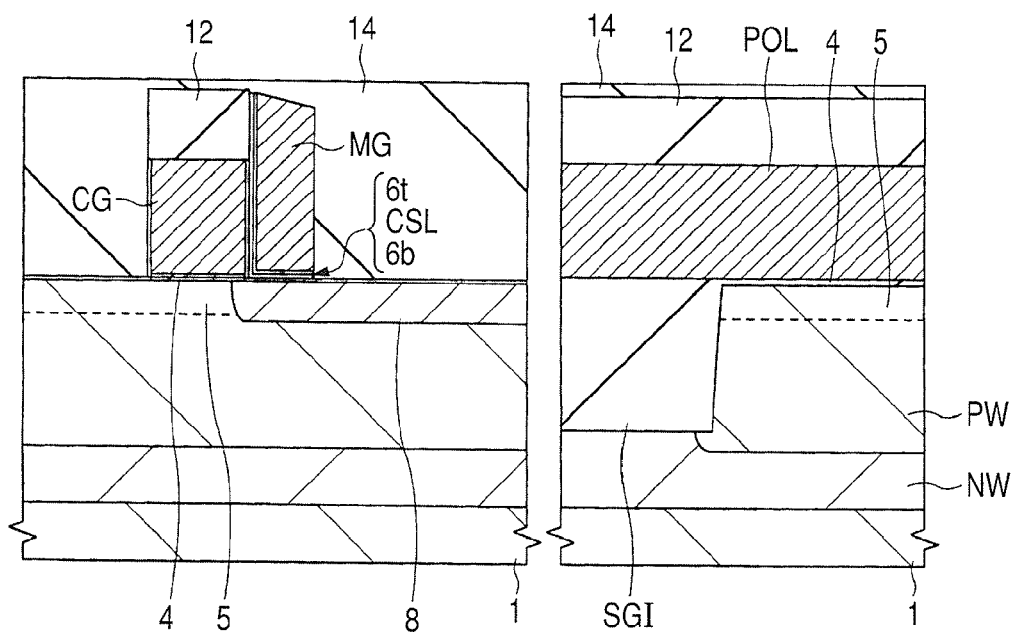
FIG. 8 is a fragmentary cross-sectional view of the semiconductor device during a manufacturing step following that of FIG. 7.
Figure 9:
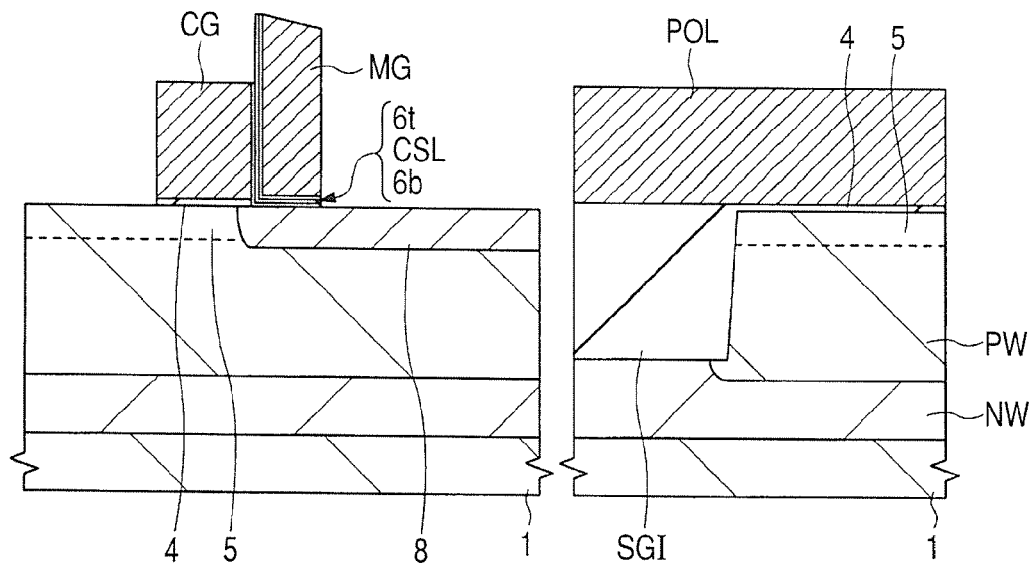
FIG. 9 is a fragmentary cross-sectional view of the semiconductor device during a manufacturing step following that of FIG. 8.
Figure 10:
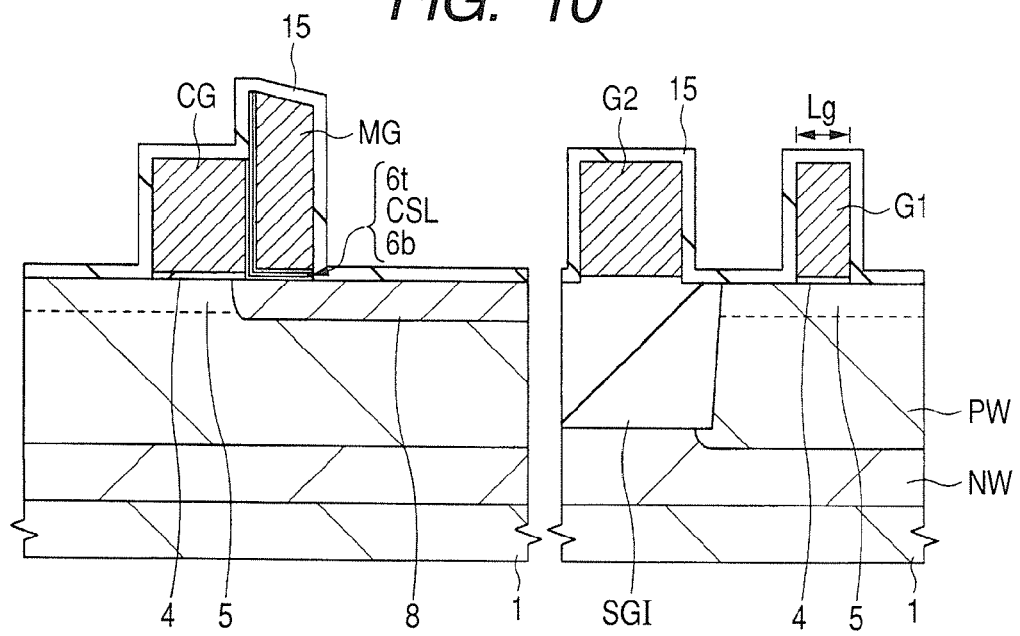
FIG. 10 is a fragmentary cross-sectional view of the semiconductor device during a manufacturing step following that of FIG. 9.

As illustrated in FIG. 8, an organic material usable as a hard mask, for example, a BARC (Bottom Anti-Reflective Coating) film 14 is then deposited over the main surface of the semiconductor substrate 1 by the method of application. As illustrated in FIG. 9, the insulating film 12 is then removed from the upper surface of the select gate electrode CG of the select nMIS (Qnc) and the upper surface of the conductor film POL in the peripheral circuit region. Since the BARC film formed over the insulating film 12 is thin, etching of the insulating film 12 may reduce the thickness of the BARC film, followed by selective removal of the insulating film 12. The BARC film 14 and the insulating film 6t that have remained over the main surface of the semiconductor substrate 1 are then removed As illustrated in FIG. 10, the conductor film POL in the peripheral circuit region is patterned by lithography and dry etching to form a gate electrode G1 of the peripheral first nMIS (Q1) and a gate electrode G2 of the peripheral second nMIS (Q2), each made of the conductor film POL is formed. The gate electrodes G1 and G2 in the active region have a gate length of, for example, about 100 nm. An insulating film 15 made of, for example, silicon oxide and having a thickness of about 10 nm is then deposited by CVD over the main surface of the semiconductor substrate 1.

Figure 11:
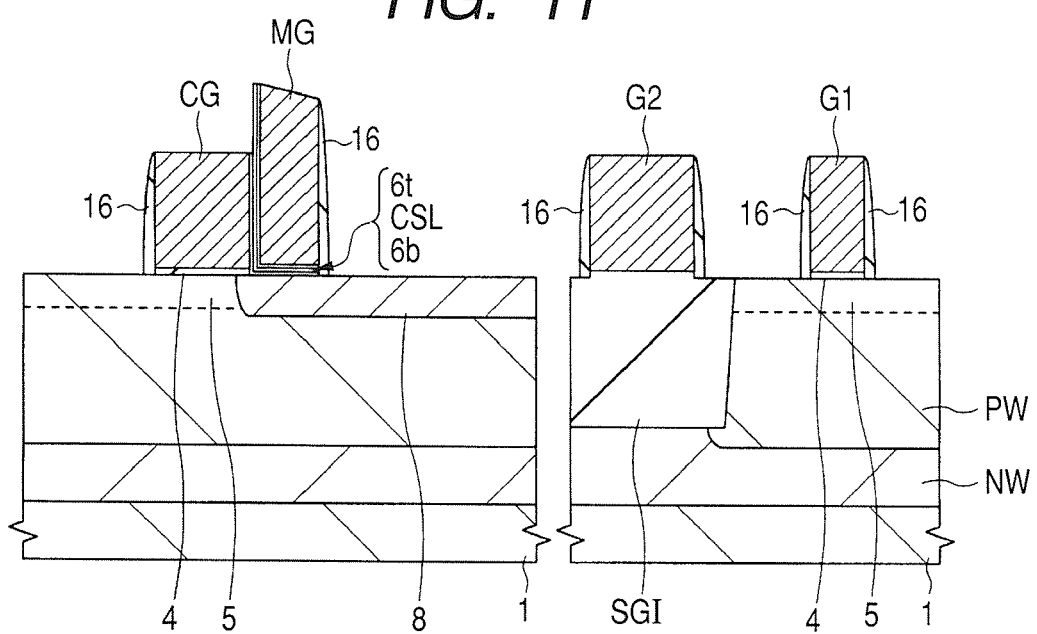
FIG. 11 is a fragmentary cross-sectional view of the semiconductor device during a manufacturing step following that of FIG. 10.

As illustrated in FIG. 11, the insulating film 15 is etched back by anisotropic dry etching to form sidewalls 16 over one of the side surfaces of the select gate electrode CG of the select nMIS (Qnc), one of the side surfaces of the memory gate electrode MG of the memory nMIS (Qnm), both of the side surfaces of the gate electrode G1 of the peripheral first nMIS (Q1), and both of the side surfaces of the gate electrode G2 of the peripheral second nMIS (Q2). The sidewall 16 has a spacer length of, for example, about 6 nm. As a result, the exposed side surface of the gate insulating film 4 between the select gate electrode CG of the select nMIS (Qnc) and the semiconductor substrate 1 and the exposed side surfaces of the insulating films 6b and 6t and the charge storage layer CSL between the memory gate electrode MG of the memory nMIS (Qnm) and the semiconductor substrate 1 can be covered with the sidewall 16.

Figure 12:
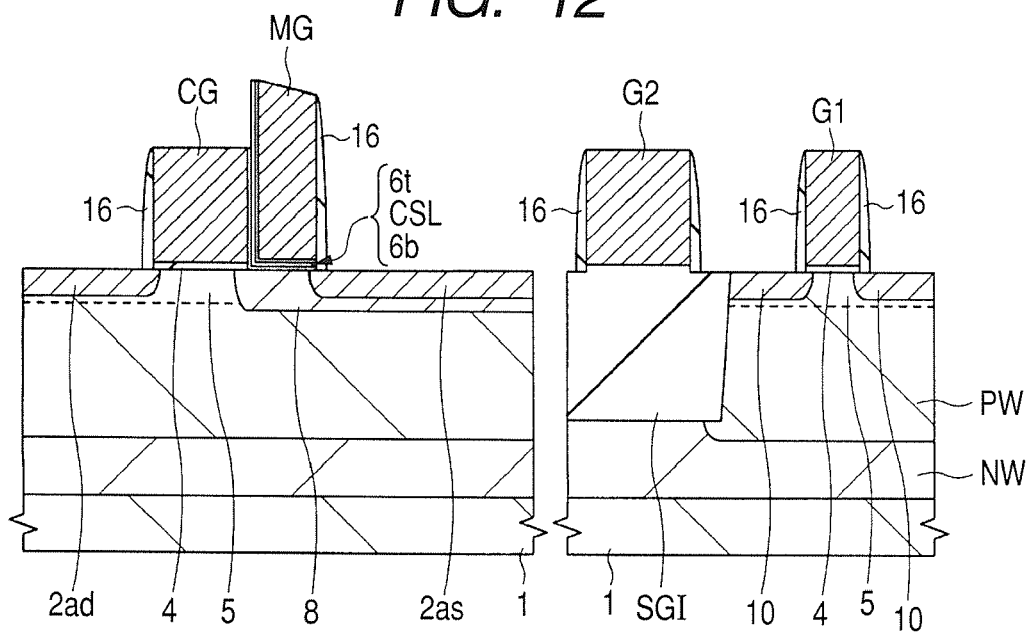
FIG. 12 is a fragmentary cross-sectional view of the semiconductor device during a manufacturing step following that of FIG. 11.

As illustrated in FIG. 12, after formation of a resist pattern that has an end portion at the upper surface of the select gate electrode CG of the select nMIS (Qnc) and covers a portion of the select gate electrode CG on a side opposite to the memory gate electrode MG of the memory nMIS (Qnm), an n type impurity such as arsenic is ion-implanted into the main surface of the semiconductor substrate 1 with the select gate electrode CG, the memory gate electrode MG, and the resist pattern as masks to form an n⁻ type semiconductor region 2as in the main surface of the semiconductor substrate 1 in self alignment with respect to the memory gate electrode MG.

After removal of the resist pattern, another resist pattern that has an end portion over the upper surface of the select gate electrode CG of the select nMIS (Qnc) and covers a portion of the select gate electrode CG on the side of the memory gate electrode MG of the memory nMIS (Qnm) and the memory gate electrode MG is formed. With the select gate electrode CG, the memory gate electrode MG, and the resist pattern as masks, an n type impurity, for example, arsenic is ion-implanted into the main surface of the semiconductor substrate 1 to form an n⁻ type semiconductor region 2ad in the main surface of the semiconductor substrate 1 in self alignment with respect to the select gate electrode CG. Instead of formation of the n⁻ type semiconductor region 2ad after formation of the n⁻ type semiconductor region 2as, the n⁻ type semiconductor region 2as may be formed after formation of the n⁻ type semiconductor region 2ad. It is also possible to successively carry out ion implantation of an n type impurity for the formation of the n⁻ type semiconductor region 2ad and ion implantation of a p type impurity, for example, boron into the main surface of the semiconductor substrate 1 to form a p type semiconductor region surrounding the lower portion of the n⁻ type semiconductor region 2ad.

Then, with the gate electrode G1 of the peripheral first nMIS (Q1), the gate electrode G2 of the peripheral second nMIS (Q2), and a resist pattern in the peripheral circuit region as masks, an n type impurity, for example, arsenic is ion-implanted into the main surface of the semiconductor substrate 1 to form n⁻ type semiconductor regions 10 in the main surface of the semiconductor substrate 1 with respect to the gate electrode G1 of the peripheral first nMIS (Q1) and the gate electrode G2 of the peripheral second MIS (Q2). Alternatively, these n⁻ type semiconductor regions 10 can also be formed simultaneously with the n⁻ type semiconductor region 2as or the n⁻ type semiconductor region 2ad.

Figure 13:
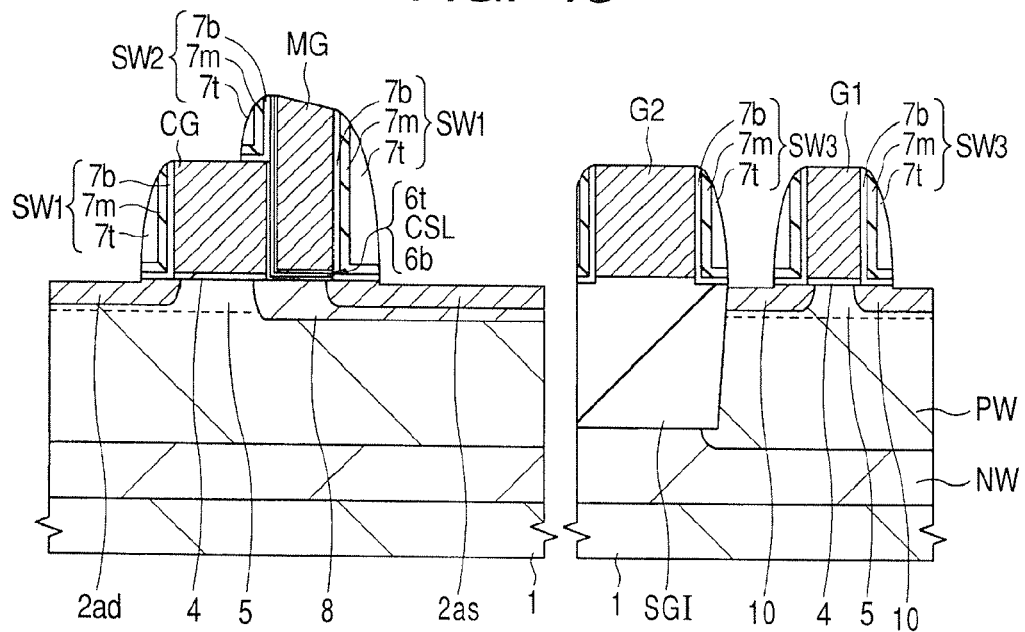
FIG. 13 is a fragmentary cross-sectional view of the semiconductor device during a manufacturing step following that of FIG. 12.

As illustrated in FIG. 13, for example, a silicon oxide film 7b, a silicon nitride film 7m, and a silicon oxide film 7t are deposited successively over the main surface of the semiconductor substrate 1 by CVD, followed by etch back of these films by anisotropic dry etching to form sidewalls SW1 over one of the side surfaces of the select gate electrode CG of the select nMIS (Qnc) on the side opposite to the memory gate electrode MG and over one of the side surfaces of the memory gate electrode MG of the memory nMIS (Qnm) on the side opposite to the select gate electrode CG; a sidewall SW2 over one of the side surfaces of the memory gate electrode MG of the memory nMIS (Qnm) on the side of the select gate electrode CG and over the upper surface of the select gate electrode CG; and sidewalls SW3 over both of the side surfaces of the gate electrode G1 of the peripheral first nMIS (Q1) and both of the side surfaces of the gate electrode G2 of the peripheral second nMIS (Q2). The silicon oxide film 7b has a thickness of, for example, about 20 nm, the silicon nitride film 7m has a thickness of, for example, about 25 nm, and the silicon oxide film 7t has a thickness of, for example, about 50 nm.

Figure 14:
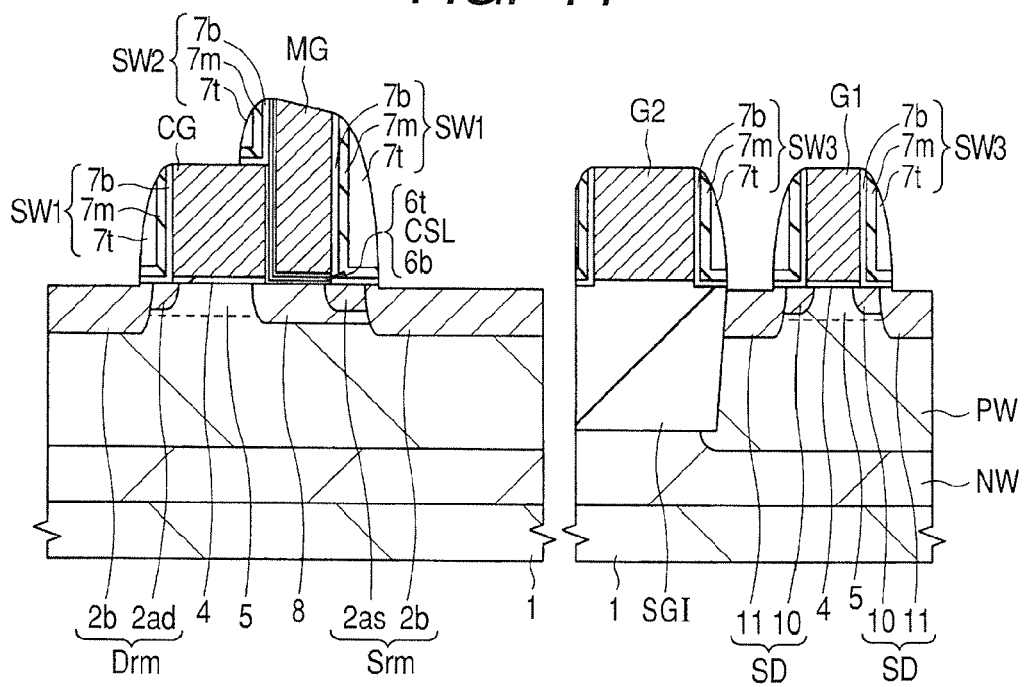
FIG. 14 is a fragmentary cross-sectional view of the semiconductor device during a manufacturing step following that of FIG. 13.

As illustrated in FIG. 14, with the sidewalls SW1 as masks, for example, arsenic or phosphorus is ion-implanted into the main surface of the semiconductor substrate 1 in the memory region to form n⁺ type semiconductor regions 2b in the main surface of the semiconductor substrate 1 in self alignment with respect to the select gate electrode CG of the select nMIS (Qnc) and the memory gate electrode MG of the memory nMIS (Qnm). In such a manner, a drain region Drm comprised of the n⁻ type semiconductor region 2ad and the n⁺ semiconductor region 2b and a source region Srm comprised of the n⁻ type semiconductor region 2as and the n⁺ type semiconductor region 2b are formed. Then, with the sidewalls SW3 as masks, an n type impurity, for example, arsenic or phosphorus is ion-implanted into the main surface of the semiconductor substrate 1 in the peripheral circuit region to form n⁺ type semiconductor regions 11 in the main surface of the semiconductor substrate 1 with respect to the gate electrode G1 of the peripheral first nMIS (Q1) and the gate electrode G2 of the peripheral second nMIS (Q2). In such a manner, source/drain regions SD each comprised of the n⁻ type semiconductor region 10 and the n⁺ type semiconductor region 11 are formed. The n⁺ type semiconductor region 11 can also be formed simultaneously with the n⁺ type semiconductor region 2b.

Figure 15:
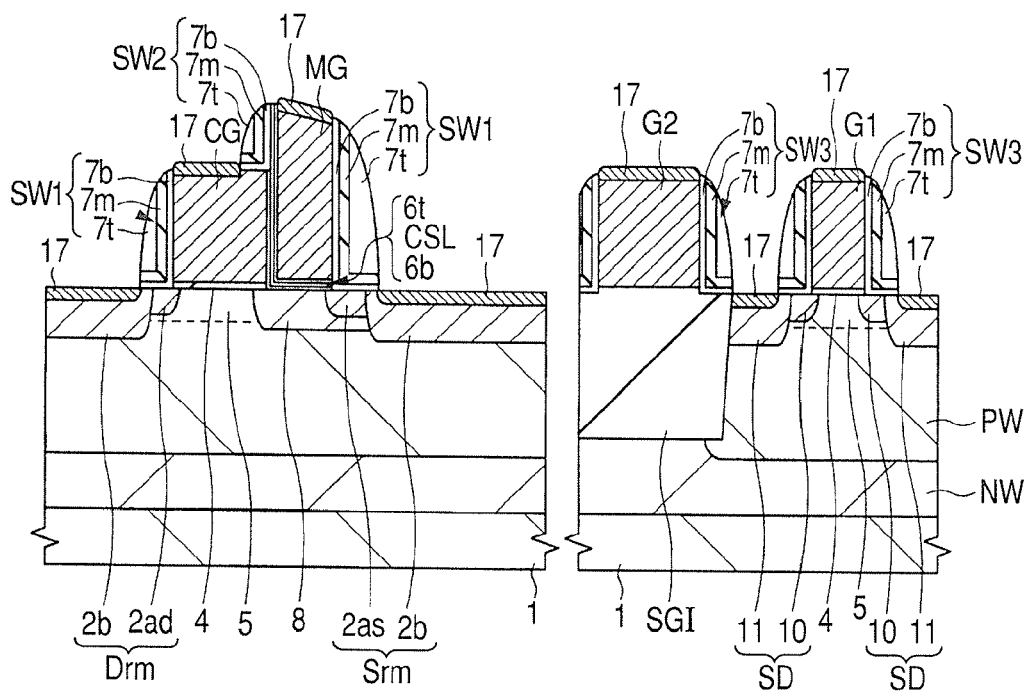
FIG. 15 is a fragmentary cross-sectional view of the semiconductor device during a manufacturing step following that of FIG. 14.

As illustrated in FIG. 15, a silicide layer, for example, a cobalt silicide (CoSi₂) layer 17 is formed over the upper surfaces of the select gate electrode CG of the select nMIS (Qnc) and the memory gate electrode MG of the memory nMIS (Qnm) and the surface of the n⁺ type semiconductor regions 2b in the memory region and the upper surfaces of the gate electrode G1 of the peripheral first nMIS (Q1) and the gate electrode G2 of the peripheral second nMIS (Q2) and the surface of the n⁺ type semiconductor regions 11 by self alignment, for example, by the silicide (Self Align silicide) process. First, a cobalt film is deposited over the main surface of the semiconductor substrate 1 by sputtering. Cobalt silicide layers 17 are then formed by heat treating the semiconductor substrate 1 by RTA (Rapid Thermal Anneal) to cause reactions between the cobalt film and polycrystalline silicon forming the select gate electrode CG of the select nMIS (Qnc), between the cobalt film and polycrystalline silicon forming the memory gate electrode MG of the memory nMIS (Qnm), between the cobalt film and polycrystalline silicon forming the gate electrode G1 of the peripheral first nMIS (Q1), between the cobalt film and polycrystalline silicon forming the gate electrode G2 of the peripheral second nMIS (Q2), and between the cobalt film and single crystal silicon forming the semiconductor substrate 1 (n⁺ type semiconductor regions 2b and 11). The cobalt film that has remained unreacted is then removed.

The cobalt silicide layer 17 thus formed is effective for reducing the contact resistance between the cobalt silicide layer 17 and a plug and the like to be formed thereabove. In the memory region, it can reduce the resistance of each of the select gate electrode CG of the select nMIS (Qnc), the memory gate electrode MG of the memory nMIS (Qnm), the source region Srm, and the drain region themselves. In the peripheral circuit region, it can reduce the resistance of each of the gate electrode G1 of the peripheral first nMIS (Q1), the gate electrode G2 of the peripheral second nMIS (Q2), and the source/drain regions SD themselves.

In the memory cell MC1 according to Embodiment 1, the sidewall SW2 is formed over the select gate electrode CG of the select nMIS (Qnc) and a wall made of the insulating film 6t and the charge storage layer CSL and higher by from about 5 to 100 nm than the upper surface of the select gate electrode CG is formed between the select gate electrode CG and the memory gate electrode MG. Even if the cobalt silicide layer 17 is formed in self alignment, the cobalt silicide layer 17 therefore does not extend over the sidewall SW2 and the wall and contact between the cobalt silicide layer 17 formed over the upper surface of the select gate electrode CG and the cobalt silicide layer 17 formed over the upper surface of the memory gate electrode MG can be prevented.

As the silicide layer 17, nickel silicide (NiSi) may be used instead of cobalt silicide. In this case, it has similar effects to those achieved by cobalt silicide and further, it can reduce the contact resistance.

Figure 16:
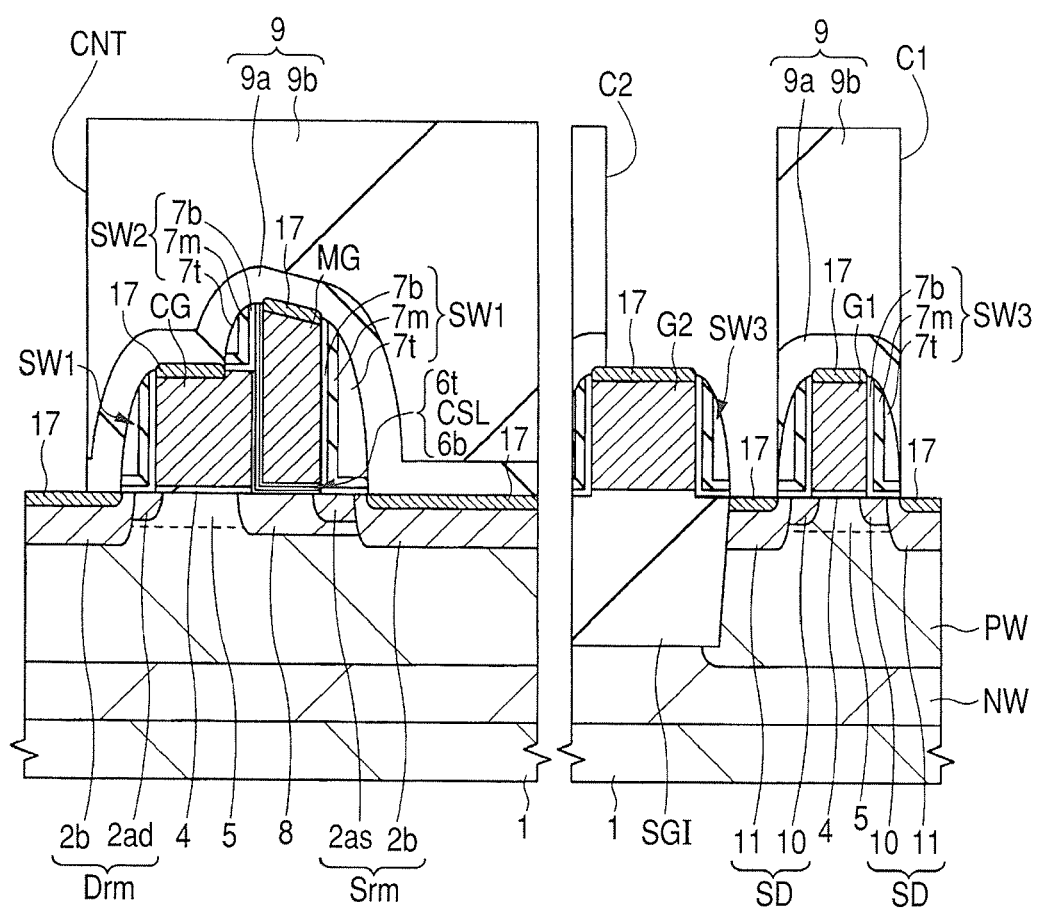
FIG. 16 is a fragmentary cross-sectional view of the semiconductor device during a manufacturing step following that of FIG. 15.

As illustrated in FIG. 16, an interlayer insulating film 9 made of, for example, a silicon nitride film 9a and a silicon oxide film 9b is formed by CVD over the main surface of the semiconductor substrate 1. After formation of contact holes CNT, C1, and C2 in the interlayer insulating film 9, a plug PLG is formed in these contact holes CNT, C1, and C2. The plug PLG has a relatively thin barrier film comprised of a film stack of, for example, titanium and titanium nitride and a relatively thick conductor film comprised of tungsten, aluminum or the like and embraced in the barrier film. A first-level interconnect M1 including, for example, copper or aluminum as a principal component is then formed over the interlayer insulating film 9 to substantially complete the memory cell MC1 and the peripheral first nMIS (Q1) and the peripheral second nMIS (Q2) formed in the peripheral circuit region as illustrated in FIG. 2. Ordinary manufacturing steps of a semiconductor device are then performed to manufacture a semiconductor device having a nonvolatile memory.

Thus, according to Embodiment 1, the height of the select gate electrode CG, the gate electrode G1 of the peripheral first nMIS (Q1), and the gate electrode G2 of the peripheral second nMIS (Q2) can be made lower than the height of the memory gate electrode MG. Since the sidewall SW1 having a relatively greater width is formed over one (side surface on the side of the source region Srm) of the side surfaces of the memory gate electrode MG of the memory nMIS (Qnm) in the memory region, the memory cell MC1 can have desired disturb characteristics. Since the sidewall SW3 having a relatively small width is formed over both of the side surfaces of the gate electrode G2 of the peripheral second nMIS (Q2) in the peripheral circuit region, it is possible to prevent the shared contact hole C2 from being filled with the sidewall SW3 and reduce a conduction failure in the shared contact hole C2.

Embodiment 2

A second example (in which the height of a gate electrode G2 of a peripheral second nMIS (Q2) from the main surface of the semiconductor substrate 1 is lower than the height of a select gate electrode CG of a select nMIS (Qnc) from the main surfaced of the semiconductor substrate 1) of a manufacturing method of a semiconductor device according to Embodiment 2 will next be described referring to FIGS. 17 to 19.

Figure 17:
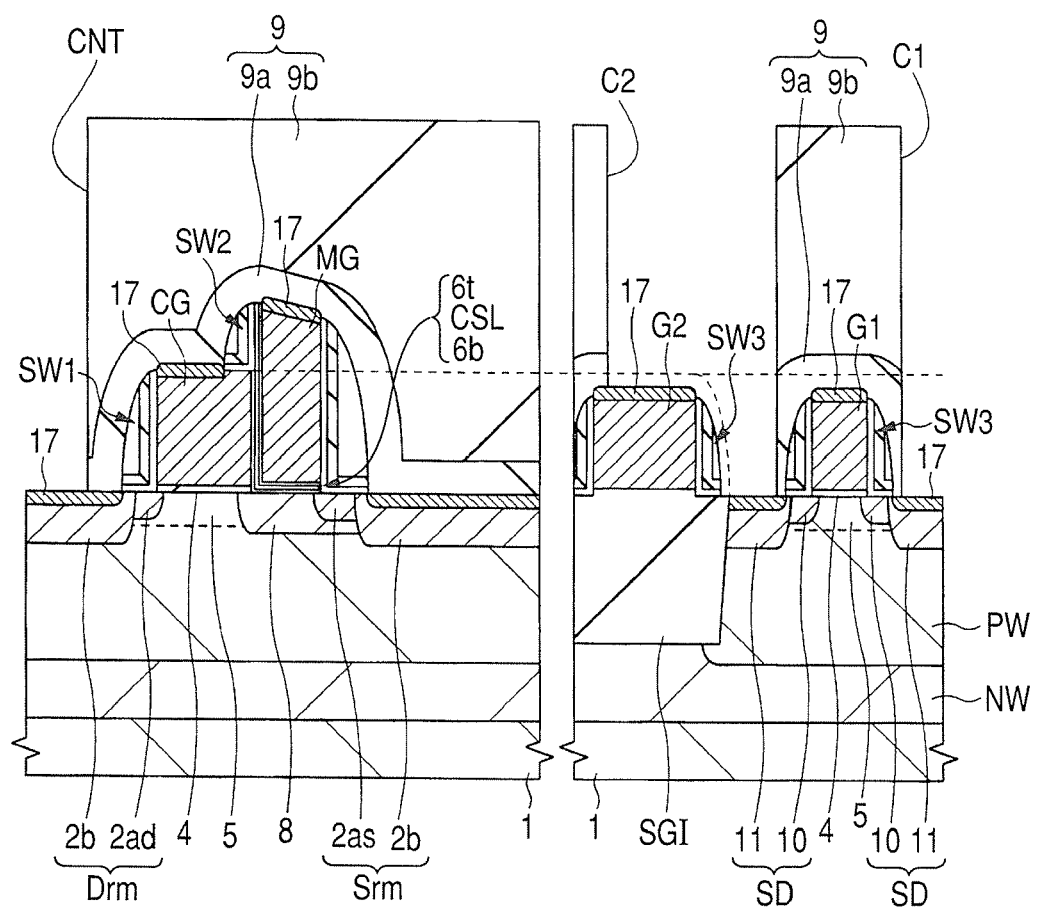
FIG. 17 includes a fragmentary cross-sectional view of a memory cell formed in a memory region and a fragmentary cross-sectional view of a peripheral first nMIS and a peripheral second nMIS formed in a peripheral circuit region according to Embodiment 2 of the invention.

FIG. 17 includes a fragmentary cross-sectional view of a memory cell formed in a memory region and a fragmentary cross-sectional view of a peripheral first nMIS and a peripheral second nMIS formed in a peripheral circuit region, according to Embodiment 2 of the invention.

Figure 18:
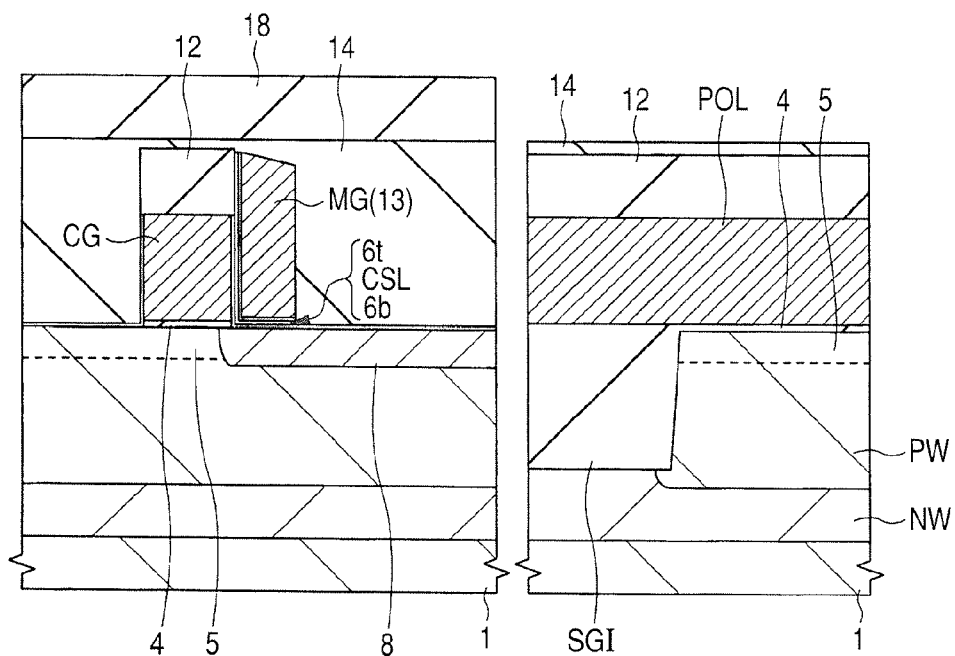
FIG. 18 is a fragmentary cross-sectional view of the semiconductor device according to Embodiment 2 of the invention during a manufacturing step thereof.
Figure 19:
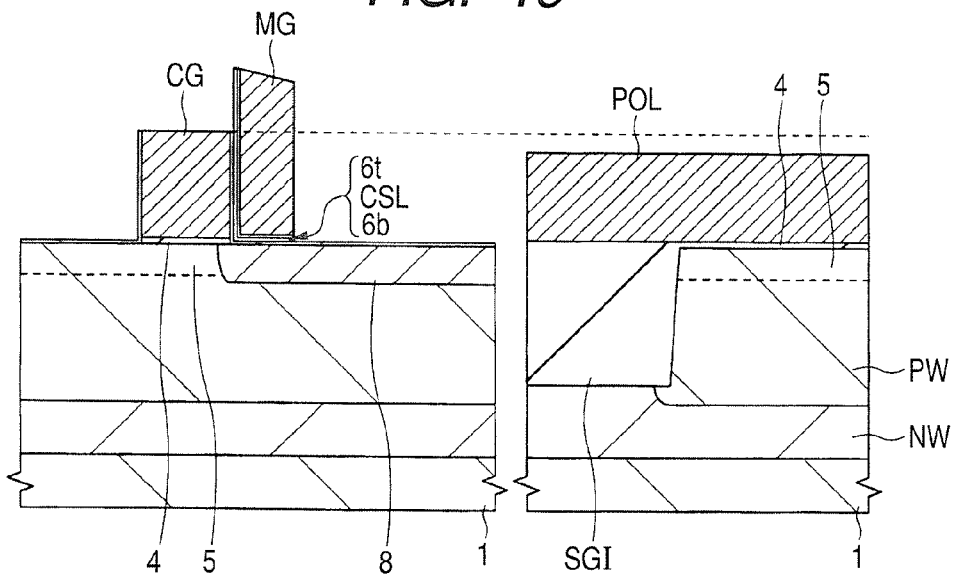
FIG. 19 is a fragmentary cross-sectional view of the semiconductor device during a manufacturing step following that of FIG. 18.

FIGS. 18 and 19 are fragmentary cross-sectional views of the memory region and the peripheral circuit region in the manufacturing steps of the semiconductor device and they illustrate the same parts as those in the fragmentary cross-sectional view of FIG. 2 illustrating the memory cell MC1 and the peripheral first nMIS (Q1) and the peripheral second nMIS (Q2) formed in the peripheral circuit region.

First, similar to the first example of the manufacturing method of the semiconductor device according to Embodiment 1, the gate electrode CG of the select nMIS (Qnc) and a gate electrode MG of a memory nMIS (Qnm) are formed in a memory region over the main surface of the semiconductor substrate 1. Prior steps are similar to those of the first example of the manufacturing method of the semiconductor device of Embodiment 1 so that description on them is omitted.

As illustrated in FIG. 18, an organic material usable as a hard mask, for example, a BARC (Bottom Anti Reflective Coating) 14 and a resist film 18 are deposited successively over the main surface of the semiconductor substrate 1 by the method of application and then, the resist film 18 is left only in the memory region.

As illustrated in FIG. 19, by using dry etching, the BARC film 14 in the peripheral circuit region is adjusted to a predetermined thickness (alternatively, after removal of the BARC film 14 from the peripheral circuit region, the insulating film 12 over the upper surface of the conductor film POL is adjusted to a predetermined thickness) and the resist film 18 is removed. Then, the BARC film 14 and the insulating film 12 over the upper surface of the select gate electrode CG of the select nMIS (Qnc) and the upper surface of the conductor film POL in the peripheral circuit region are removed by dry etching.

Alternatively, it is also possible to, after the BARC film 14 is removed from the peripheral circuit region and the insulating film 12 over the upper surface of the conductor film POL is adjusted to a predetermined thickness, remove the resist film 18 and then carry out dry etching to remove the BARC film 14 and the insulating film 12 over the upper surface of the select gate electrode CG of the select nMIS (Qnc) and the upper surface of the conductor film POL in the peripheral circuit region.

Since the BARC film 14 in the peripheral circuit region is thinner than the BARC film 14 in the memory region, the insulating film 12 over the upper surface of the conductor film POL in the peripheral circuit region is removed earlier than the insulating film 12 over the upper surface of the select gate electrode CG of the select nMIS (Qnc) in the memory region. After the conductor film POL is exposed from the peripheral circuit region, the conductor film POL in the peripheral circuit region is etched to a desired thickness by dry etching. Then, the BARC film 14 that has remained over the main surface of the semiconductor substrate 1 and the insulating film 12 over the upper surface of the select gate electrode CG of the select nMIS (Qnc) are removed.

The memory cell MC1, the peripheral first nMIS (Q1), the peripheral second nMIS (Q2), a first-level interconnect M1 and the like are formed by the manufacture procedure similar to that of the first example of the manufacturing method of the semiconductor device according to Embodiment 1 to substantially complete the formation of the memory cell MC1 and the peripheral first nMIS (Q1) and the peripheral second nMIS (Q2) in the peripheral circuit region.

As shown by the dotted line of FIG. 17, the height of the gate electrode G1 of the peripheral first nMIS (Q1) and the height of the gate electrode G2 of the peripheral second nMIS (Q2) can be made lower than the height of the select gate electrode CG in Embodiment 2 compared with Embodiment 1. This enables to reduce the width of the sidewall SW3 further. As a result, Embodiment 2 is more effective for reducing the conduction failure in the shared contact hole C2 than Embodiment 1.

Embodiment 3

Figure 20:
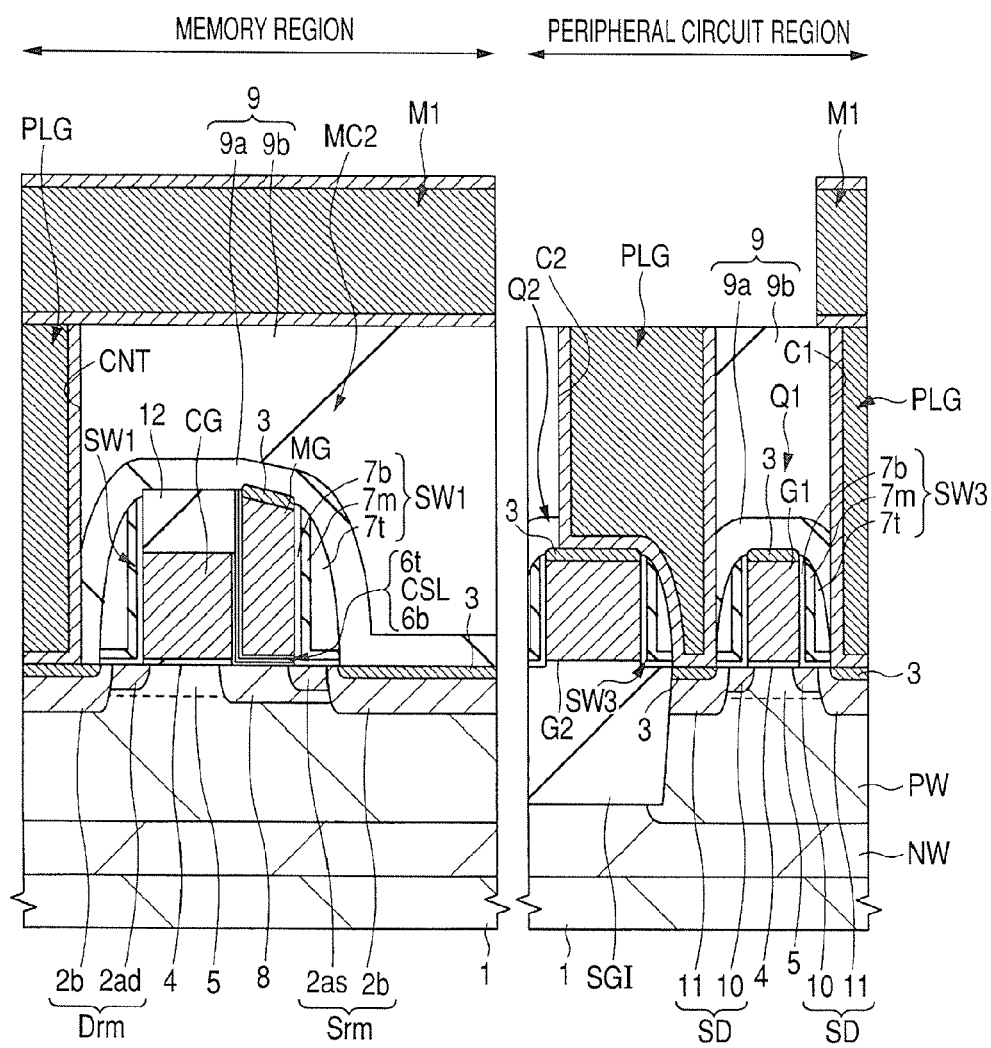
FIG. 20 includes a fragmentary cross-sectional view of a memory cell formed in a memory region and a fragmentary cross-sectional view of a peripheral first nMIS and a peripheral second nMIS formed in a peripheral circuit region according to Embodiment 3 of the invention.

An example of the structure of a memory cell according to Embodiment 3 of the invention will next be described referring to FIG. 20. FIG. 20 is an enlarged fragmentary cross-sectional view of a memory cell obtained by cutting its channel along a direction intersecting with a memory gate electrode. The memory cell illustrated in this drawing is a memory cell having a split gate structure while having a sidewall-like raised memory gate electrode. Since the structures of nMISs formed in the peripheral circuit region are similar to those of the peripheral first nMIS (Q1) and the peripheral second nMIS (Q2) described above in Embodiment 1, description on them is omitted.

Similar to the memory cell MC1 of Embodiment 1, a memory cell MC2 is comprised of a select nMIS (Qnc) and a memory nMIS (Qnm). The select gate electrode CG of the select nMIS (Qnc) and the memory gate electrode MG of the memory nMIS (Qnm) extend adjacent to each other and the height of the select gate electrode CG from the main surface of the semiconductor substrate 1 is made lower than the height of the memory gate electrode MG from the main surface of the semiconductor substrate 1. The select gate electrode CG and the memory gate electrode MG are insulated by insulating films 6b and 6t and a charge storage layer CSL. The height of the insulating film 6b placed between the select gate electrode CG and the memory gate electrode MG from the main surface of the semiconductor substrate 1 is equal to the height of the upper surface of the select gate electrode CG from the main surface of the semiconductor substrate, whereas the height of the insulating film 6t and charge storage layer CSL placed between the select gate electrode CG and the memory gate electrode MG from the main surface of the semiconductor substrate 1 is equal to the height of the upper surface of the memory gate electrode MG from the main surface of the semiconductor substrate 1. A drain region Drm has a relatively lightly-doped $n^-$ type semiconductor region 2ad and a relatively heavily-doped $n^+$ semiconductor region 2b having a higher impurity concentration than that of the $n^-$ type semiconductor region 2ad, whereas a source region Srm has a relatively lightly-doped n⁻ type semiconductor region 2as and a relatively heavily-doped n⁺ semiconductor region 2b having a higher impurity concentration than that of the n⁻ type semiconductor region 2as. In addition, sidewalls SW1 are formed over one (the side surface on the side opposite to the memory gate electrode and on the side of the drain region Drm) of the side surfaces of the select gate electrode CG and one (the side surface on the side opposite to the select gate electrode CG and on the side of the source region Srm) of the side surfaces of the memory gate electrode.

In the memory cell MC1 of Embodiment 1 described above, however, a sidewall SW2 that is an equal layer to the layer of the sidewall SW1 of the memory gate electrode MG and is comprised of a silicon oxide film 7b, a silicon nitride film 7m, and a silicon oxide film 7t is formed over the side surface of the memory gate electrode MG on the side of the select gate electrode CG and at the same time, over the upper surface of the select gate electrode CG. This sidewall SW2, the insulating film 6t, and the charge storage layer CSL serve to insulate the select gate electrode CG from the memory gate electrode MC. In the memory cell MC2 of Embodiment 3, on the other hand, the insulating film 12 is formed over the entire upper surface of the select gate electrode CG and this insulating film 12, the insulating film 6t, and the charge storage layer CSL serve to insulate the select gate electrode CG from the memory gate electrode MG.

A silicide layer 3 is formed over the upper surface of the memory gate electrode MG of the memory nMIS (Qnm) in the memory region and the upper surface of the n⁺ type semiconductor region 2b forming the source region Srm or the drain region Drm, but is not formed over the upper surface of the select gate electrode CG of the select nMIS (Qnc). No short-circuit therefore occurs between the select gate electrode CG and the memory gate electrode MG via the silicide layer 3.

Thus, the height of the memory gate electrode MG of the memory nMIS (Qnm) from the main surface of the semiconductor substrate 1 can also be made greater than the height of the select gate electrode CG of the select nMIS (Qnc) from the main surface of the semiconductor substrate 1 as in Embodiment 1 by forming the insulating film 12 over the entire upper surface of the gate electrode CG of the select nMIS (Qnc). In addition, the height of the gate electrode G2 of the peripheral second nMIS (Q2) from the main surface of the semiconductor substrate 1 can be made equal to or lower than the height of the select gate electrode CG of the select nMIS (Qnc) from the main surface of the semiconductor substrate 1 by forming the gate electrode G2 of the peripheral second nMIS (Q2) in the peripheral circuit region from the same conductor film and by the same manufacturing step as those employed for the select gate electrode CG of the select nMIS (Qnc).

As a result, the memory cell MC2 can have desired disturb characteristics by relatively increasing the width of the sidewall SW1 over one (the side surface on the side of the source region Srm) of the side surfaces of the memory gate electrode MG of the memory nMIS (Qnm). At the same time, it is possible to prevent the shared contact hole C2 from being filled with the sidewall SW3 and reduce a conduction failure in the shared contact hole C2 by relatively decreasing the width of the sidewall SW3 over the side surface of the gate electrode G2 of the peripheral second nMIS (Q2) formed in the peripheral circuit region.

One example of a manufacturing method of the semiconductor device according to Embodiment 3 will next be described referring to FIGS. 21 to 27. FIGS. 21 to 27 are fragmentary cross-sectional views illustrating a memory region and a peripheral circuit region in the manufacturing steps of the semiconductor device and they illustrate the same parts as those in the fragmentary cross-sectional view of FIG. 20 illustrating the memory cell MC2 and the peripheral first nMIS (Q1) and the peripheral second nMIS (Q2) formed in the peripheral circuit region.

First, similar to the first example of the manufacturing method of the semiconductor device according to Embodiment 1 and as illustrated in FIG. 7, a gate electrode CG of a select nMIS (Qnc) and a gate electrode MG of a memory nMIS (Qnm) are formed in a memory region over the main surface of a semiconductor substrate 1. Manufacturing steps prior to it are similar to those of the first example of the manufacturing method of the semiconductor device of Embodiment 1 so that description on them is omitted.

Figure 21:
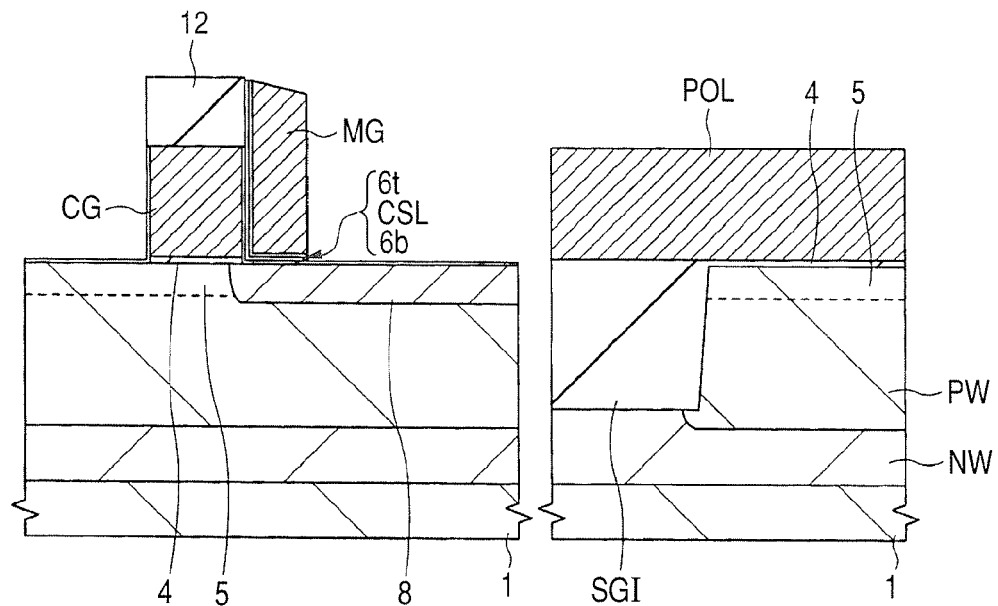
FIG. 21 is a fragmentary cross-sectional view of the semiconductor device according to Embodiment 3 of the invention during a manufacturing step thereof.
Figure 22:
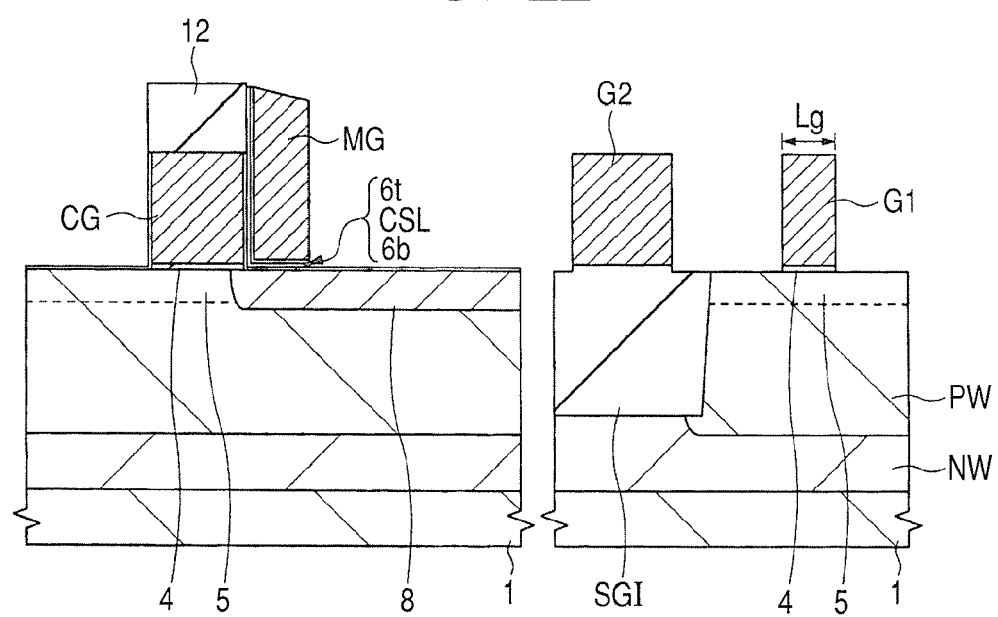
FIG. 22 is a fragmentary cross-sectional view of the semiconductor device during a manufacturing step following that of FIG. 21.

As illustrated in FIG. 21, the insulating film 12 is removed from the upper surface of the conductor film POL in the peripheral circuit region by dry etching. The conductor film POL exposed from the peripheral circuit region may be etched to make the conductor film POL in the peripheral circuit region thinner than the gate electrode CG of the select nMIS (Qnc) in the memory region. As illustrated in FIG. 22, the conductor film POL in the peripheral circuit region is patterned by lithography and dry etching to form a gate electrode G1 of the peripheral first nMIS (Q1) and a gate electrode G2 of the peripheral second nMIS (Q2) each made of the conductor film POL. In the active region, the gate electrodes G1 and G2 have a gate length of, for example, about 100 nm.

Figure 23:
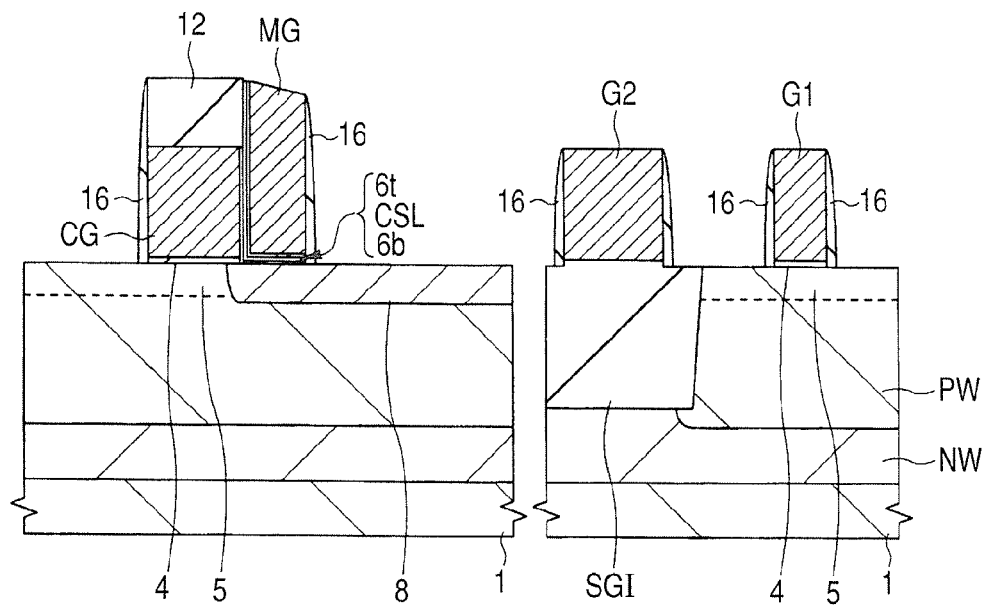
FIG. 23 is a fragmentary cross-sectional view of the semiconductor device during a manufacturing step following that of FIG. 22.

As illustrated in FIG. 23, after deposition of an insulating film made of, for example, silicon oxide and having a thickness of about 10 nm over the main surface of the semiconductor substrate 1 by CVD, the insulating film is etched back by anisotropic dry etching to form side walls 16 over one of the side surfaces of the select gate electrode CG of the select nMIS (Qnc), one of the side surfaces of the memory gate electrode MG of the memory nMIS (Qnm), both of the side surfaces of the gate electrode G1 of the peripheral first nMIS (Q1), and both of the side surfaces of the gate electrode G2 of the peripheral second nMIS (Q2). The sidewalls 16 have a spacer length of, for example, about 6 nm. With the sidewalls 16 thus formed, the exposed side surface of the gate insulating film 4 between the select gate electrode CG and the semiconductor substrate 1 and the exposed side surface of the insulating films 6b and 6t and charge storage layer CSL between the memory gate electrode MG and the semiconductor substrate 1 can be covered.

Figure 24:
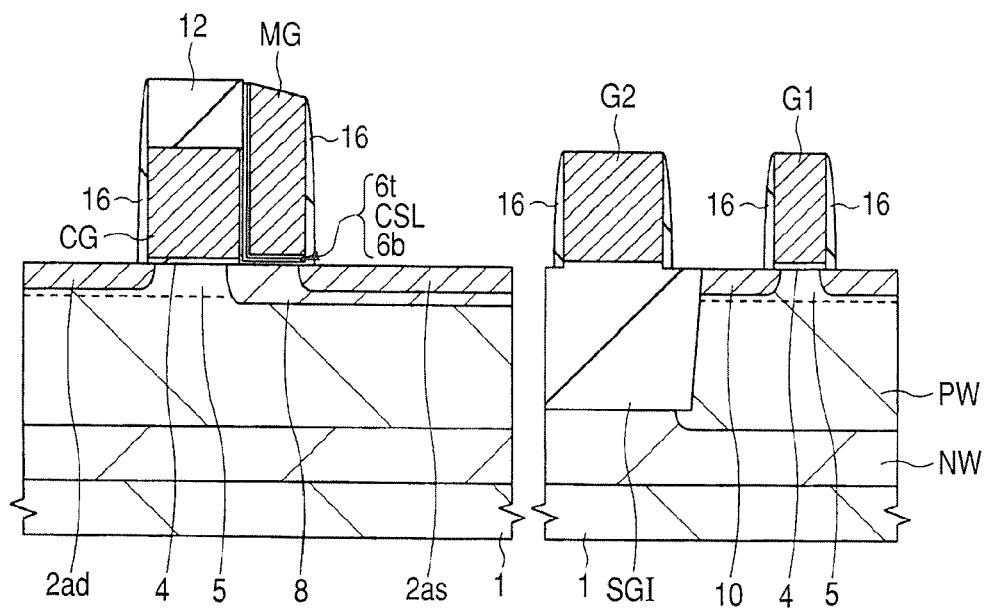
FIG. 24 is a fragmentary cross-sectional view of the semiconductor device during a manufacturing step following that of FIG. 23.

As illustrated in FIG. 24, as in Embodiment 1, an n⁻ type semiconductor region 2as is formed in the main surface of the semiconductor substrate 1 in self alignment with respect to the memory gate electrode MG of the memory nMIS (Qnm); an n⁻ type semiconductor region 2ad is formed in the main surface of the semiconductor substrate 1 in self alignment with respect to the select gate electrode CG of the select nMIS (Qnc); and n⁻ type semiconductor regions 10 are formed in the main surface of the semiconductor substrate 1 in self alignment with respect to the gate electrode G1 of the peripheral first nMIS (Q1) and the gate electrode G2 of the peripheral second nMIS (Q2).

Figure 25:
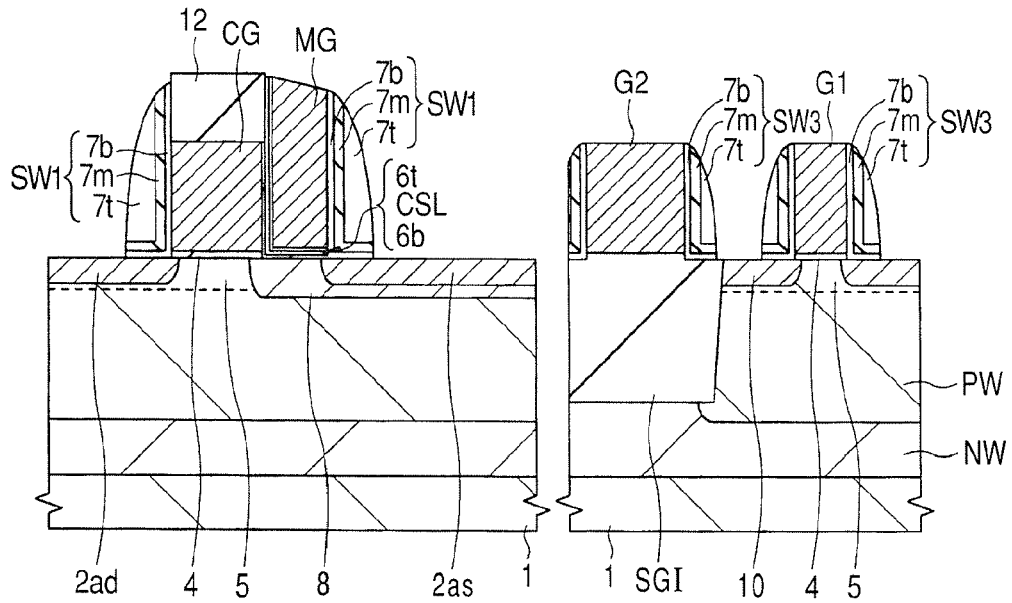
FIG. 25 is a fragmentary cross-sectional view of the semiconductor device during a manufacturing step following that of FIG. 24.

As illustrated in FIG. 25, for example, a silicon oxide film 7b, a silicon nitride film 7m, and a silicon oxide film 7t are deposited successively over the main surface of the semiconductor substrate 1 by CVD, followed by etching them back by anisotropic dry etching to form sidewalls SW1 and SW3 made of the silicon oxide film 7b, the silicon nitride film 7m, and the silicon oxide film 7t over one of the side surfaces of the select gate electrode CG of the select nMIS (Qnc) and one of the side surfaces of the memory gate electrode MG of the memory nMIS (Qnm); and both of the side surfaces of the gate electrode G1 of the peripheral first nMIS (Q1) and both of the side surfaces of the gate electrode G2 of the peripheral second nMIS (Q2); respectively.

Figure 26:
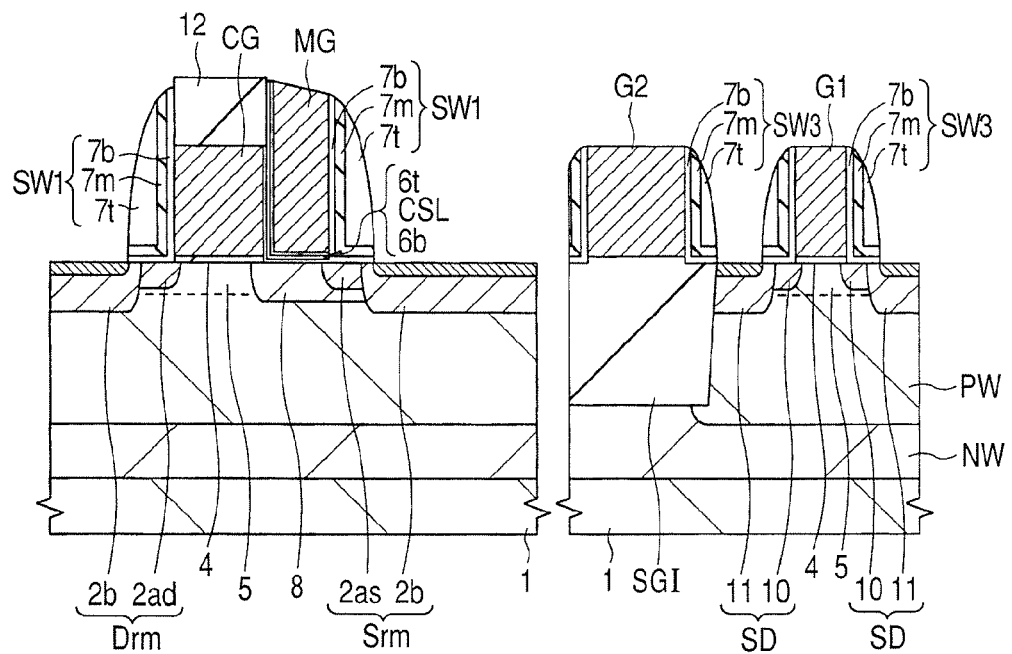
FIG. 26 is a fragmentary cross-sectional view of the semiconductor device during a manufacturing step following that of FIG. 25.

As illustrated in FIG. 26, similar to Embodiment 1, an n⁺ type semiconductor region 2b is formed in the main surface of the semiconductor substrate 1 in self alignment with respect to the select gate electrode CG of the select nMIS (Qnc) and the memory gate electrode MG of the memory nMIS (Qnm). As a result, a drain region Drm comprised of the n⁻ type semiconductor region 2ad and the n⁺ type semiconductor region 2b and a source region Srm comprised of the n⁻ type semiconductor region 2as and the n⁺ type semiconductor region 2b are formed. Then, n⁺ type semiconductor regions 11 are formed in the main surface of the semiconductor substrate 1 in self alignment with respect to the gate electrode G1 of the peripheral first nMIS (Q1) and the gate electrode G2 of the peripheral second nMIS (Q2). This results in the formation of source/drain regions SD comprised of the n⁻ type semiconductor regions 10 and the n⁺ type semiconductor regions 11.

Figure 27:
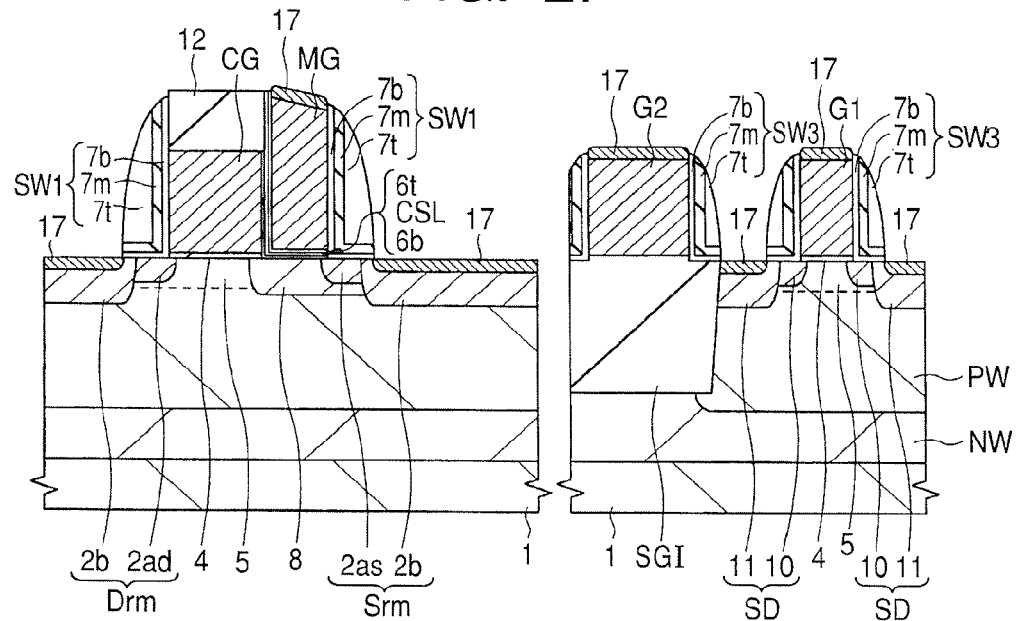
FIG. 27 is a fragmentary cross-sectional view of the semiconductor device during a manufacturing step following that of FIG. 26.

As illustrated in FIG. 27, similar to Embodiment 1, a silicide layer, for example, a cobalt silicide layer 17 is formed over the upper surface of the memory gate electrode MG of the memory nMIS (Qnm) and the surface of the n⁺ type semiconductor regions 2b in the memory region and the upper surfaces of the gate electrode G1 of the peripheral first nMIS (Q1) and the gate electrode G2 of the peripheral second nMIS (Q2) and the surface of the n⁺ type semiconductor regions 11 by the self alignment process, for example, silicide process.

Then, a first-level interconnect M1 and the like are formed using the manufacture procedure similar to that of the first example of the manufacturing method of the semiconductor device according to Embodiment 1 to substantially complete the formation of the memory cell MC2 and the peripheral first nMIS (Q1) and the peripheral second nMIS (Q2) in the peripheral circuit region. Steps subsequent thereto are performed by the ordinary manufacturing steps of a semiconductor device to complete a semiconductor device having a nonvolatile memory.

Embodiment 3 has thus similar effects to those achieved by Embodiment 1.

The invention made by the present inventors was described in detail based on some Embodiments. It should however be borne in mind that the invention is not limited to or by these embodiments. It is needless to say that it can be changed without departing from the scope of the invention.

The invention can be utilized for a semiconductor element equipped with a first gate electrode and a second gate electrode that are adjacent to each other via an insulating film, particularly, a semiconductor device having a memory cell having two transistors and a split gate structure.

The invention claimed is:

1. A semiconductor device having a nonvolatile memory cell equipped with a first field effect transistor in a first region of a memory region, a second field effect transistor adjacent to the first field effect transistor in a second region of the memory region over a main surface of a semiconductor substrate, and a third field effect transistor in a peripheral circuit region over the main surface of the semiconductor substrate, the semiconductor device comprising:
   a first insulating film formed in the first region;
   a first gate electrode of the first field effect transistor formed in the first region over the first insulating film;
   a second insulating film formed in the second region and having a charge storage layer having a charge storage function;
   a second gate electrode of the second field effect transistor formed in the second region over the second insulating film;
   a third insulating film formed in the peripheral circuit region;
   a third gate electrode of the third field effect transistor formed in the peripheral circuit region over the third insulating film; and
   a semiconductor region of the third field effect transistor formed in the semiconductor substrate in the peripheral circuit region,
   wherein a height of the first gate electrode from the main surface of the semiconductor substrate is less than a height of the second gate electrode from the main surface of the semiconductor substrate,
   wherein a height of the third gate electrode of the third field effect transistor from the main surface of the semiconductor substrate is equal to or less than the height of the first gate electrode from the main surface of the semiconductor substrate,
   wherein a first sidewall is formed over a side surface of the second gate electrode at a side of the second gate electrode that is opposite the first gate electrode,
   wherein a second sidewall is formed over a side surface of the third gate electrode, the semiconductor region being adjacent to the second sidewall,
   wherein a width of the first sidewall is greater than a width of the second sidewall,
   wherein a shared contact hole reaching the third gate electrode and the semiconductor region is formed over the second sidewall, and
   wherein the third gate electrode and the semiconductor region are electrically coupled together via a conductor film filling the shared contact hole.

2. The semiconductor device according to claim 1, wherein the height of the first gate electrode from the main surface of the semiconductor substrate is less than the height of the second gate electrode from the main surface of the semiconductor substrate by 5 to 100 nm.

3. The semiconductor device according to claim 1, wherein a third sidewall is formed over a side surface of the second gate electrode at a side of the second gate electrode adjacent to the first gate electrode and at over a portion of an upper surface of the first gate electrode.

4. The semiconductor device according to claim 3, wherein a silicide layer is formed over another portion of the upper surface of the first gate electrode that does not have the second sidewall formed thereover and over an upper surface of the second gate electrode.

5. The semiconductor device according to claim 1, wherein a third insulating film is formed over an entire upper surface of the first gate electrode and a height of a film stack of the first gate electrode and the third insulating film is equal to or greater than the height of the second gate electrode from the main surface of the semiconductor substrate.

6. The semiconductor device according to claim 5, wherein a silicide layer is formed over an upper surface of the second gate electrode.

7. The semiconductor device according to claim 5, wherein the third insulating film is a silicon oxide film or a silicon nitride film.

8. The semiconductor device according to claim 1, wherein the height of the third gate electrode from the main surface of the semiconductor substrate is 200 nm or less.

9. The semiconductor device according to claim 1, wherein a drain region of the nonvolatile memory cell is formed in the semiconductor substrate at a side of the first gate electrode that is opposite to the second gate electrode, and a source region of the nonvolatile memory cell is formed in the semiconductor substrate at the side of the second gate electrode that is opposite to the first gate electrode.

* * * * *